US009012306B2

(12) United States Patent
Beaumont et al.

(10) Patent No.: US 9,012,306 B2
(45) Date of Patent: Apr. 21, 2015

(54) MANUFACTURING OF LOW DEFECT DENSITY FREE-STANDING GALLIUM NITRIDE SUBSTRATES AND DEVICES FABRICATED THEREOF

(75) Inventors: Bernard Beaumont, Le Tignet (FR); Jean-Pierre Faurie, Valbonne (FR)

(73) Assignee: Saint-Gobain Cristaux et Detecteurs, Courbevoie (FR)

( * ) Notice: Subject to any disclaimer, the term of this patent is extended or adjusted under 35 U.S.C. 154(b) by 937 days.

(21) Appl. No.: 13/167,925

(22) Filed: Jun. 24, 2011

(65) Prior Publication Data
US 2011/0316000 A1 Dec. 29, 2011

Related U.S. Application Data

(63) Continuation-in-part of application No. PCT/EP2008/068290, filed on Dec. 24, 2008.

(51) Int. Cl.
*H01L 21/20* (2006.01)
*C30B 25/18* (2006.01)
(Continued)

(52) U.S. Cl.
CPC ............... *C30B 25/18* (2013.01); *C30B 29/406* (2013.01); *H01L 21/0237* (2013.01); *H01L 21/0242* (2013.01); *H01L 21/02458* (2013.01); *H01L 21/0254* (2013.01); *H01L 21/0262* (2013.01); *H01L 21/02639* (2013.01); *H01L 21/02647* (2013.01); *H01L 21/0265* (2013.01)

(58) Field of Classification Search
CPC ............... H01L 21/0254; H01L 21/02458; H01L 21/02389; H01L 21/02008; H01L 21/2018; H01L 21/20
USPC ................ 438/478; 257/76, E29.089, E21.09
See application file for complete search history.

(56) References Cited

U.S. PATENT DOCUMENTS

| 6,325,850 | B1 | 12/2001 | Beaumont et al. |
| 6,355,497 | B1 | 3/2002 | Romano et al. |

(Continued)

FOREIGN PATENT DOCUMENTS

| CN | 1882720 A | 12/2006 |
| EP | 1059662 A1 | 12/2000 |

(Continued)

OTHER PUBLICATIONS

Russian Office Action dated Aug. 7, 2012, with regard to corresponding Russian application No. 2011127319 and translation thereof.

(Continued)

*Primary Examiner* — Marc Armand
*Assistant Examiner* — Sarah Salerno
(74) *Attorney, Agent, or Firm* — Abel Law Group, LLP; Robert N. Young

(57) ABSTRACT

The invention relates to a method for manufacturing a single crystal of nitride by epitaxial growth on a support (100) comprising a growth face (105), the method comprising the steps of formation of a sacrificial bed (101) on the support (100), formation of pillars (102) on said sacrificial bed, said pillars being made of a material compatible with GaN epitaxial growth, growth of a nitride crystal layer (103) on the pillars, under growing conditions such that the nitride crystal layer does not extend down to the support in holes (107) formed between the pillars, and removing the nitride crystal layer from the support.

19 Claims, 16 Drawing Sheets

(51) Int. Cl.
*C30B 29/40* (2006.01)
*H01L 21/02* (2006.01)

(56) References Cited

U.S. PATENT DOCUMENTS

| | | | |
|---|---|---|---|
| 6,380,108 | B1 | 4/2002 | Linthicum et al. |
| 6,586,778 | B2 | 7/2003 | Linthicum et al. |
| 6,599,362 | B2 | 7/2003 | Ashby et al. |
| 6,802,902 | B2 | 10/2004 | Beaumont et al. |
| 7,282,381 | B2 | 10/2007 | Feltin et al. |
| 2001/0039102 | A1* | 11/2001 | Zheleva et al. ............ 438/478 |
| 2002/0014681 | A1* | 2/2002 | Tsuda et al. ............ 257/618 |
| 2002/0022287 | A1* | 2/2002 | Linthicum et al. ........ 438/46 |
| 2008/0006849 | A1 | 1/2008 | Liu et al. |
| 2009/0236697 | A1* | 9/2009 | Ono et al. ............ 257/618 |

FOREIGN PATENT DOCUMENTS

| | | |
|---|---|---|
| EP | 1422748 A | 5/2004 |
| JP | 2003518737 A | 6/2003 |
| WO | 0147002 A | 6/2001 |
| WO | 03100839 A2 | 12/2003 |

OTHER PUBLICATIONS

Canadian Office Action dated Aug. 13, 2012, with regard to corresponding Canadian application No. 2,747,574.

Bougrioua et al., "Growth of freestanding GaN using pillar-epitaxial-lateral overgrowth from GaN nanocolumns," Elsevier, Journal of Crystal Growth, vol. 309, No. 2, dated Nov. 15, 2007, pp. 113-120.

The International Search Report and the Written Opinion for International Application No. PCT/EP2008/068290 received from the International Searching Authority (EPO), dated Jul. 31, 2009, 16 pages.

E. Fetlin et al., "Epitaxial Lateral Overgrowth of GaN on Silicon (111)," Wiley-VCH Verlag Berlin GmbH, 10386 Berlin, phys. stat. Sol. (a) 188, No. 2, dated 2001, pp. 733-737.

Pierre Gibart, "Metal organic vapour phase epitaxy of GaN and lateral overgrowth," Institute of Physics Publishing, <http://iopscience.iop.org/0034-4885/675/R02> Reports on Progress in Physics, 67, published Apr. 7, 2004, downloaded on Apr. 2, 2012, pp. 667-715.

S. Gradecak et al., "Bending of dislocations in GaN during epitaxial lateral overgrowth," <http://dx.doi.org/10.1063/1.1823593>, American Institute of Physics, Applied Physics Letters, vol. 85, No. 20, dated Nov. 15, 2004, 4 pages.

Shuji Nakamura et al., "Violet InGaN/GaN/AlGaN-Based Laser Diodes Operable at 50° C. with a Fundamental Transverse Mode," Jpn. J. Appl. Phys. vol. 38, Part 2, No. 3A, dated Mar. 1, 1999, 4 pages.

Oh-Hyun Nam et al., "Lateral epitaxy of low defect density GaN layers via organometallic vapor phase epitaxy," American Institute of Physics, <http://dx.doi.org/10.1063/1.120164>, Applied Physics Letters, vol. 71, dated 1997, downloaded Februaury 3, 2012, 4 pages.

R.F. Davis et al., "Review of pendeo-epitaxial growth and characterization of thin films of GaN and AlGaN alloys on 6H-SiC(0001) and Si(111) substrates," The Materials Research Society, MRS Internet Journal of Nitride Semiconductor Research, vol. 6, Issue 14, downloaded May 25, 2012, 20 pages.

C. Sasaoka et al., "High-quality InGaN MQW on low-dislocation-density GaN substrate grown by hydride vapor-phase epitaxy," Elsevier Science B.V., Journal of Crystal Growth 189/190, dated 1998, 6 pages.

Shigetaka Tomiya et al., "Defects in degraded GaN-based laser diodes," <www.physica-statis-solidi.com>, Wiley-VCH Verlang GmbH & Co. KGaA, Weinheim, phys. stat. sol. (a) 200, No. 1, dated 2003, 4 pages.

Tsvetanka S. Zheleva et al., "Pendeo-Epitay—A New Approach for Lateral Growth of Gallium Nitride Structures," Materials Research Society, Mat. Res. Soc. Symp. Proc. vol. 537, MRS Internet J. Nitride Semicond. Res. 4S1, G3.38, dated 1999, 6 pages.

* cited by examiner

4μm

4μm

4μm

4μm

4μm

4μm

4μm

4μm

4μm

10μm

10μm

4μm

4μm

4μm

4μm

MANUFACTURING OF LOW DEFECT DENSITY FREE-STANDING GALLIUM NITRIDE SUBSTRATES AND DEVICES FABRICATED THEREOF

FIELD OF THE INVENTION

The present invention concerns high quality free standing gallium nitride wafers suitable for the subsequent growth of efficient device structures and a method of manufacture thereof.

More specifically, the invention relates to a process for growth of low dislocation density GaN on a substrate, to a process for epitaxial growth where the lateral and vertical growth rates of the material are controlled by growth conditions, to a process of separation from the starting substrate.

The present invention also relates to a nitride semiconductor wafer having a GaN crystal formed by such a method and a nitride semiconductor device produced therefrom.

DESCRIPTION OF THE STATE OF THE ART

GaN-based compound semiconductors, such as gallium nitride (GaN), the ternary alloys, indium gallium nitride (InGaN) and gallium aluminium nitride (GaAlN) and even the quaternary (AlGaInN) are direct band gap semiconductors. Their gaps cover wavelengths extending from visible to UV. Henceforth, nitride alloy semiconductors are recognized as having great potential for short wave length emission. GaN is used in the manufacture of light emitting diodes (LEDs), blue-violet laser diodes (LDs) and UV detectors. The next generation of high density disc systems (blu-ray DVD and HD-DVD) will require GaN blue-violet LD. In addition to optoelectronics, due to its intrinsic properties (wide gap, high thermal and chemical stability, high electron saturation velocity), GaN will be used as well in the fabrication of high-temperature electronics devices.

Unfortunately, the development of nitride materials has been hampered by problems in the processing technology of such materials. One problem in the development of Group III-N devices is the lack of gallium nitride bulk substrates of acceptable usable area or of lattice-matched substrates for growth of low-defect density III-N layers. GaN cannot be melted and pulled from a boule like silicon, gallium arsenide, or sapphire, because at usual pressures its theoretical melting temperature exceeds its dissociation temperature.

Substantial difficulties have been shown when attempting to obtain large-area crystals of any Group III-nitride that could provide suitable substrates for device fabrication. GaN bulk crystals can be grown by high pressure high temperature melt growth in liquid Ga. This technology has been developed at UNIPRESS (Poland), but the size of the substrate ($\sim 1$ cm$^2$) and the volume of the potential mass production do not reach by far the industrial needs. Nevertheless low defect densities $\sim 10^2$ to $10^5$ cm$^{-2}$ have been achieved using this method. (I. Grzegory and S. Porowski, Thin Solid Films, 367, 281 (2000).

The techniques currently used for the fabrication of relatively high quality GaN and related layers involve the heteroepitaxial deposition of a GaN device layer onto a suitable but non-ideal substrate. Currently such substrates include (but are not limited to) sapphire, silicon or silicon carbide. All heteroepitaxial substrates present challenges to the high-quality deposition of GaN, in the form of lattice and thermal mismatch. Lattice mismatch is caused by the difference in interatomic spacing of atoms in dissimilar crystals. Thermal mismatch is caused by differences in the thermal expansion coefficient between dissimilar materials.

Since the lattice constant of a sapphire substrate differs from that of GaN, a continuous GaN single crystalline film cannot be grown directly on the sapphire substrate. Therefore, a process wherein the strain of the lattice is, to some extent, relieved in a buffer layer of AlN or GaN grown on the sapphire substrate at a low temperature, and then GaN is grown thereon has been proposed, and is currently achieved routinely. The use of a nitride layer grown at a low temperature as a buffer layer has enabled the single-crystalline epitaxial growth of GaN. However, even this method cannot compensate the lattice-mismatch between the substrate and the crystal, and the GaN film has still numerous defects.

Sapphire and SiC have become the standard substrates for Group III-N growth, despite significant lattice mismatches. Such large mismatches lead to the formation of very high densities of threading dislocations ($\sim 10^9$ cm$^{-2}$) and eventually cracks. Thermal mismatch should also be considered. Typically, the GaN is grown, for instance, onto sapphire or SiC at a temperature of between 1000-1100° C.; as the sample cools down to room temperature, the difference in thermal expansion (contraction) rates gives rise to high levels of stress at the interface between the two materials. Sapphire has a higher coefficient of thermal expansion than does GaN. As the sapphire substrate and GaN layer cool down, the mismatch at the interface puts the GaN under compression and the sapphire under tension. Thus, the amount of stress is directly related to the thickness of the deposited GaN, such that the thicker the film, the greater the stress. Above a film thickness of approximately 10 microns, the stress levels exceed the fracture limits of the GaN, and cracking and peeling of the film may result. Cracks in this layer are even worse than high dislocations, and should be avoided because of their catastrophic propagation into the device layer during subsequent processing steps.

All the technological development of the epitaxy of GaN or sapphire or SiC aims to reduce the TD density and avoid crack formation.

The occurence of extended defects (threading dislocations, stacking faults, and antiphase boundaries) leads to significantly deteriorated performances and results in a shortened operating lifetime of devices. More specifically, the dislocations behave as nonradiative centres, thus reducing the light-emitting efficiency of light-emitting diodes and laser diodes made from these materials. These dislocations also increase the dark current. Although threading dislocations have not prevented the development of high-brightness light-emitting diodes, they limit the lifetime and cause catastrophic failure in laser diodes. They also cause excessive reverse-bias leakage currents in p-n junction devices such as high electron-mobility transistors, field-effect transistors and other electronic devices. Further, the dislocations can act as strong scattering centres for carriers, thus reducing the mobility of electrons and holes unfavourably, limiting the performance of many semiconductor devices.

Henceforth, there is an urgent need for high quality free standing GaN with uniform distribution of threading dislocations. This implies the ability of growing thick low dislocation density GaN layers and to properly separate the thick HVPE layer from the starting substrate. It has been shown by Takeya et al., phys. stat. sol. (c) 0, 7, 2292 (2003) that to reach an operating time of $10^4$ hours in LDs, the starting substrate should have less than $3 \times 10^6$ TD·cm$^{-2}$ present.

Numerous methods to reduce the TD and other extended defect density have been proposed.

MOVPE is the most widely used method for growing GaN based device structure and is well known by the skilled person in the art. Some of the methods known include low temperature buffer layers, SiN nanomasking, low temperature AlN interlayers, Si-δ doping. These methods are reviewed in "P. Gibart, Metal organic vapour phase epitaxy of GaN and lateral overgrowth, Reports on Progress in Physics, 67 (2004) 667".

Techniques for reducing the density of crystalline defects density using Epitaxial Lateral Overgrowth (ELO) are widely documented, see for instance "Epitaxial Lateral Overgrowth of GaN, B. Beaumont, P. Vennèguès and P. Gibart, Phys.stat.sol(b) 227, 1-43 (2001) Special issue, Interface and defects at Atomic Level".

Further, it is disclosed in "S. Nakamura et al., Jpn. J. Appl. Phys. 38 (1999) p 226" that an operating life-time of 10000 hours of the gallium nitride blue laser diode device can be obtained through the use of these techniques.

Epitaxial lateral overgrowth (ELO) involves at least two growth steps. ELO takes advantage of the faster growth of GaN in one given crystallographic direction to produce lower dislocation densities (less than approximately $10^7$ cm$^{-2}$). Nam et al. (O. Nam, M. Bremser, T. Zheleva, and R. Davis, Appl. Phys. Lett., 71(18), 1997, 2638-2640) describe the production of Group III-V semiconductor materials using ELO. This ELO method requires an initial growth of a GaN layer on a substrate, removal from the growth reactor, ex-situ processing, deposition of dielectric masks, and re-insertion into the growth reactor. Various etching and other processing steps are included.

In the standard ELO technology, growth process is tailored to promote lateral growth where TDs are not propagating. However, TDs dislocations are still propagating above the opening in the mask and devices like LD should be made on stripe above the masked area.

In the two-step ELO (U.S. Pat. No. 6,325,850) these drawbacks are to some extent avoided. Actually, in the first step, the growth conditions of GaN are adjusted to produce triangular stripes with {11-22} lateral facets. The growth rate of the top (0001) facet is higher than the growth rate of the inclined {1122} lateral facets. This first step is pursued until the top facet completely vanishes. Indeed, this first step with the occurrence of lateral facets favours TDs reduction through bending at 90° of the TDs, this bending behavior has been stressed out by Sasaoka et al, J. Cryst. Growth 189-190, 61 (1998). Actually, this first step which results in an efficient reduction of the threading dislocation densities and is pursued as suitable, is the basic concept used in the FIELO process.

Then, in a second step, the lateral growth is favoured until complete coalescence and smoothing of the surface. Increasing the lateral growth rate can be achieved either by increasing the temperature, or introducing Mg in the vapour phase, or decreasing the pressure. The dislocations above the window first propagate vertically, (as in the standard-ELO), but afterwards bend by 90° to adopt a direction along the (0001) basal plane. The bending of most of the dislocations results in a drastic reduction of their density in the upper part of the film, i.e. for a thickness greater than the height of the pyramids obtained at the end of the first growth step. After bending, most of the dislocations have a line parallel to [1-210] which extends to the coalescence boundary with the overgrown GaN coming from the adjacent stripe. The boundary is therefore an area of defect accumulation.

Several types of behaviors of the dislocations in the boundary have been observed:
bending down to the void resulting in their termination therein,
bending up in the boundary and threading up to the surface.
A half loop is formed between two dislocations having the same Burger vector but coming from adjacent overgrowth. However, TDs that did not bent downwards or create a half loop, merge on the surface.
TDs bending can be explained qualitatively, from a simple free energy minimization viewpoint:
the Burgers vector of the TDs is not normal to the surface; this causes a straight dislocation line to feel forces tending to orient it at a certain angle to the normal.

These forces acting on such a line are the sum of two terms, one acts to rotate the line so that it is normal to the surface, while the second term acts to align the dislocation with the Burgers vector. As the line energy of a dislocation depends also of its character, the energy of a screw being the lowest, bending at 90° of an edge eventually produce a screw dislocation, or introduce a screw component thus lowering the enthalpy of the system. This behavior of TD in the 2S-ELO technology has been recently quantified using the anisotropic theory to calculate dislocations energies in GaN as a function of their line direction, S. Gradčak et al, Appl. Phys. Lett., 85, 4648 (2004).

Two-step ELO, also called FACELO (US) or FIELO (US) and cantilever Epitaxy (CE) as described in U.S. Pat. No. 6,599,362 has also proven to be efficient in reducing the TDs density. Actually this method involves the same basic mechanisms than in ELO. Numerous improvements of the standard technologies have been proposed.

The pendeo-epitaxial method is described by Linthicum et al. (K. Linthicum, T. Gehrke, D. Thomson, K. Tracy, E. Carlson, T. Smith, T. Zheleva, C. Zorman, M. Mehregany, and R. Davis, MRS Internet J. Nitride Semicond. Res. 4S1, G4.9, 1999) and Zheleva et al. (T. Zheleva, S. Smith, D. Thomson, T. Gehrke, K. Linthicum, P. Rajagopal, E. Carlson, W. Ashmawi, and R. Davis, MRS Internet J. Nitride Semicond. Res. 4S1, G3.38, 1999), requires an initial growth of a Group III-N layer on a substrate, removal from the growth reactor, ex-situ processing, and re-insertion into the growth reactor. In the PE method, lateral growth of GaN films suspended from (1120) side walls of (0001) oriented GaN columns into and over adjacent etched wells has been achieved via metal-organic vapour phase epitaxy (MOVPE) without the use of, or contact with, a supporting mask or substrate.

Even though ELO or pendeo technologies have significantly improved the quality of heteroepitaxial GaN, some drawbacks remain and are difficult to overcome. Whatever the ELO process, coalescence boundaries are created that are regions of poor quality. Therefore, optoelectronic devices should be fabricated on the good part of the ELO surface, thereby requiring complex technology.

Besides, getting thick ELO layers won't result in a disappearance of the coalescence boundaries, but conversely more likely in a spreading of this defective region. What is needed are GaN wafers with uniform distribution of TDs.

Historically, HVPE was the first method to produce epitaxial layers in the early 1970s. Because HVPE was unable to produce p-type GaN, it was largely abandoned in the early 1980s. Nowadays, the renewed interest in this method lies in its ability to grow GaN at high growth rates and thereby allow the fabrication of pseudo-substrates or free standing GaN. Growing thick HVPE is used to get low dislocations density, typically <$10^7$ cm$^{-2}$. An analysis of the reduction mechanisms in GaN proposed by Mathis et al, J. Cryst. Growth, 2001, predicts a decrease of the TD as a function of the thickness h as $h^{-2/3}$. This means that very thick layers (~300 μm up to 1 mm) are required to reduce the TDs below $10^7$ $cm^{-2}$. In other words, by growing thicker layers more interactions between dislocations can take place. Indeed interactions are more efficient close to the interface where more mixed dislocations are present. As the layer becomes thicker, this leaves primarily edge dislocations with larger separation, therefore interactions become less and less likely and a further decrease of the density of TDs becomes difficult. Actually, these TDs reduction mechanisms are very inefficient, and a closer look at the reduction mechanisms show that the most efficient reduction process comes from mixed dislocations.

Therefore, one way to get faster reduction with thickness is to increase the proportion of mixed TDs in the starting layer. This has been achieved in the patent of ATMI (reference) in which the proportion of mixed TDs was increased by low surface mobility conditions, basically lower temperature, ~1000° C. Their TEM data for GaN grown at 1000° C. and 1050° C. indeed show that in the sample grown at 1050° C. most of the TDs run parallel to the growth direction whereas in GaN grown at 1000° C. they do not. It is also shown in the ATMI patent that this low temperature layer reduces the formation of cracks. Free-standing GaN with TDs densities of $3 \times 10^6$ cm−2 were obtained following this process.

ELO technologies have also been implemented in HVPE, but due to the high growth rate, wide pitch of the ELO openings in masks are required and new dislocations are often generated. HVPE is currently widely used to grow thick GaN layers to be eventually removed from the substrate.

ELO and PE can be achieved by MOVPE, HVPE or even Close Space Vapour Transport (CSVT).

The GaN thick layers should be, at some stage, properly separated from the sapphire substrate; this means without introducing cracks or strain and make it epiready. Several routes for separating the substrate are achievable. The most straightforward one implies polishing and grinding. This however has proven to be a difficult task.

Laser lift-off (LLO) is a technique for separation of a GaN layer from a sapphire substrate by focussing a UV laser beam through the transparent sapphire substrate so that it decomposes a thin GaN region close to the interface to sapphire due to thermal heating, producing liquid Ga and N2 gas." This technology has proven its ability to properly produce 2" free standing GaN.

When ions like $H^+$ are implanted in a semiconductor, a brittle region is created at a depth which is tuned by the energy of the ions. In Si, under thermal annealing the hydrogen atoms create microbubbles of $H_2$ that allows the separation of a thin layer. In GaN, the mechanisms are not yet fully established; however the implantation of hydrogen is used to create a brittle region in an ELO quality GaN/sapphire. The hydrogen implantation does not degrade the quality of the GaN starting layer. Annealing is not carried out at this stage. Conversely, this implanted layer is introduced in a HVPE reactor where a thick layer (several hundred μm) is grown on top. After growth, during cooling, the HVPE layer is separated from the starting template. (WO 03/100839).

A Ti interlayer between the GaN template and the thick HVPE GaN layer results in the formation of tiny voids at the interface which allow an easy separation.

A single-crystal silicon-based intermediate layer is deposited on the starting substrate (sapphire). Then this sacrificial layer is spontaneously vaporised during the Group III-nitride epitaxy step. This produces free standing GaN (WO 05/031045).

Free standing GaN can be obtained from layers grown by pendeo-epitaxy on weak posts that are configured to crack due to the thermal expansion coefficient mismatch between the substrate and the GaN layer on the weak posts. (U.S. Pat. No. 6,586,778).

Apart from separation to get free standing GaN wafers, several methods have been reported (see for instance U.S. Pat. No. 6,355,497, EP 1 059 662) in which LED structures have been grown on ELO quality GaN laying on SiO2 mask and them separated by chemical etching of the SiO2 mask.

The present invention aims to provide a method of manufacturing low dislocation density (<$10^6$ $TDcm^{-2}$) free standing GaN substrates with uniformly distributed TD.

SUMMARY OF THE INVENTION

To this end, the invention combines ELO technology with an original separation process.

In particular, the invention relates to a method for manufacturing a single crystal of nitride by epitaxial growth on a support 100 comprising a growth face, the method comprising the steps of:
  formation of a sacrificial bed 101 on the support,
  formation of pillars 102 on said sacrificial bed 101, said pillars 102 being made of a material compatible with GaN epitaxial growth,
  growth of a nitride crystal layer 103 on the pillars 102, under growing conditions such that the nitride crystal layer 103 does not extend down to the support within the holes formed between the pillars,
  removing the nitride crystal layer 103 from the support 100.

Thus, and as will become clearer in the following, the formation of pillars on a sacrificial bed allows reducing the Threading Dislocations in the nitride crystal layer.

Preferred non-limitative aspects of the semiconductor according to the invention will be described hereafter with reference to FIGS. 11a and 11b.

Preferably, each pillar 102 comprises walls 104. In that case the walls 104 are substantially perpendicular to the growth face 105 of the support 100.

It will be understood in the following that a wall is considered as being "perpendicular to the growth face" when the mean plane of the wall is perpendicular to the growth face.

Preferably, the pillars 102 have the same height. However, the pillars 102 may also have different height if suitable.

The superior faces 106 of the pillars 102 define a growth face of the pillars 102. Advantageously, the surface of the growth face 106 of the pillars 102 can be above 20% of the overall surface of the growth face 105 of the support 100. Furthermore, the surface of the growth face 106 of the pillars 102 can be below 80% of the overall surface of the growth face 105 of the support 100.

Preferably, the ratio D/d of the height D of one pillar 102 to the distance d between two adjacent pillars 102 is superior or equal to 1.5, and more preferably superior or equal to 2.

The ratio D/d is preferably chosen in order to avoid the filling of the space between the pillars. In other word, the ratio D/d is chosen such that there remains a hole between the growth face of the support and the nitride crystal layer 103 grown on the pillars 102.

In one embodiment of the present invention, the pillars 102 are discrete pillars.

Advantageously, the pillars 102 are uniformly distributed on the support 100.

As mentioned above, the pillars are made of a material compatible with GaN epitaxial growth. This allows reducing the defects in the nitride crystal layer 103. In one embodiment, the pillars are made of GaN.

The sacrificial bed 101 can be made of a chemically removable material in order to facilitate the separation of the nitride crystal layer 103. For instance, the sacrificial bed 101 can be made of SiO2.

The sacrificial bed 101 can be continuous so that the sacrificial bed 101 covers the total surface of the growth face 105 of the support 100, as shown on FIG. 1a.

The sacrificial bed 101 can also be discontinuous so that the sacrificial bed 101 comprises holes 107 extending perpendicularly to the growth face 105 of the support 100, as shown on FIG. 1b.

Preferably, the holes 107 are between the pillars 102, each portion of the discontinuous sacrificial bed 101 being under a respective pillar 102 covering the overall surface of said portion.

The pillars 102 can be formed using different techniques. In a first embodiment, the pillars 102 are formed by:
  epitaxial growth of GaN layer on the sacrificial bed,
  deposition of a mask on the GAN layer, said mask comprising a plurality of openings,
  etching of the GaN layer down to the support in order to form the GaN pillars 102.

In a second embodiment, the pillars 102 are formed by:
  obtaining a GaN layer comprising pillars
  bonding the pillars on the sacrificial bed,
  removing the GaN layer extending above the pillars.

In the case of the second embodiment, the step of removing the nitride crystal layer from the support can comprise the chemical etching of the sacrificial bed.

In all cases, the method can comprise a step of deposition of a second sacrificial layer on the bottom of the pillars. This facilitates the removal of the nitride crystal layer 103 from the pillars 102.

Another aspect of the present invention concerns a substrate for manufacturing a single crystal of nitride by epitaxial growth, said substrate comprising a support 100 and a plurality of pillars 102 on the support 100, wherein said substrate further comprises a sacrificial bed 101 between the support 100 and the pillars 102 as defined above.

The invention further concern a semi-conductor material comprising a substrate and a single crystal of nitride 103 on the substrate, wherein said substrate comprises a support 100, a sacrificial bed 101 on the support 100, and a plurality of pillars 102 on said sacrificial bed 101 as defined above.

Finally, the invention concerns a single crystal 103 of nitride comprising pillars 102, said single crystal being obtained by a method as defined above.

DESCRIPTION OF THE ACCOMPANYING DRAWINGS

Other characteristics, objects and advantages of the present invention appear on reading the following detailed description and from the accompanying drawings given as non-limiting examples, and in which:

FIGS. 1A to 1I is a schematic cross-sectional view perpendicular to the [1-100] direction of GaN grown by the two-step-ELO showing the different steps of the ELO technology until full coalescence taken from a real experiment; In FIG. 1(d) to (i) the sapphire substrate has been omitted for clarity;

FIG. 2A to 2D schematically illustrates the technological steps to get low dislocation density GaN pillars on removable selective masks;

FIG. 4A is the SEM image of the cross sectional structure after regrowth from pillar whereas

Figure 7:
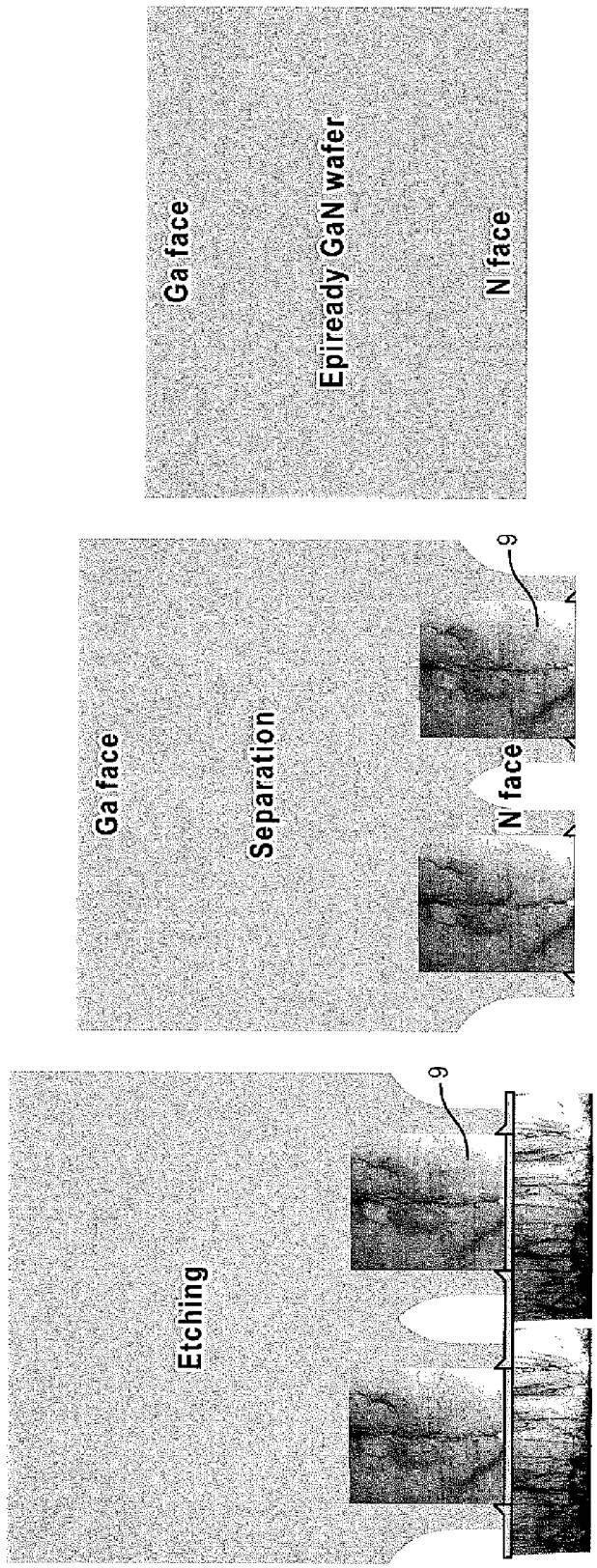
Figure 8A:
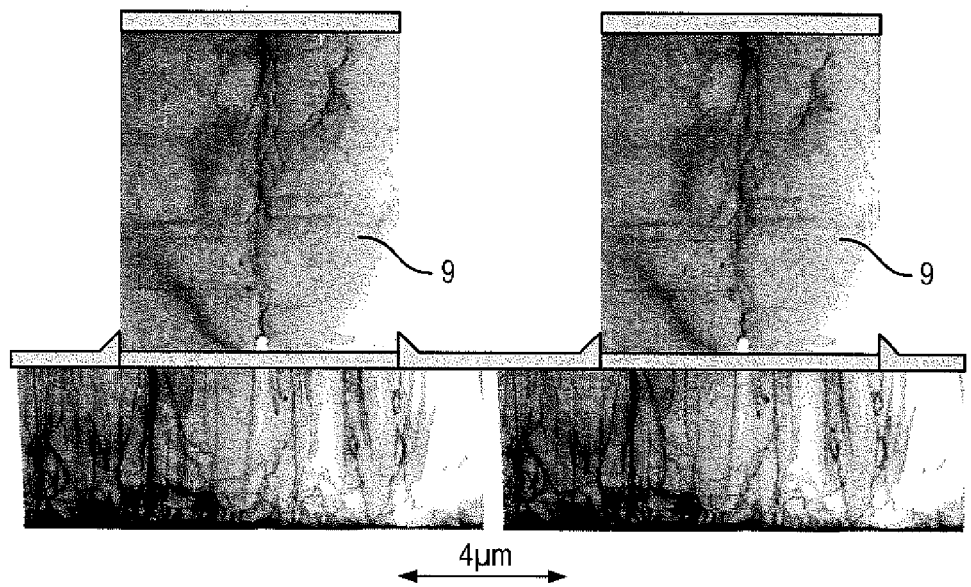
Figure 8B:
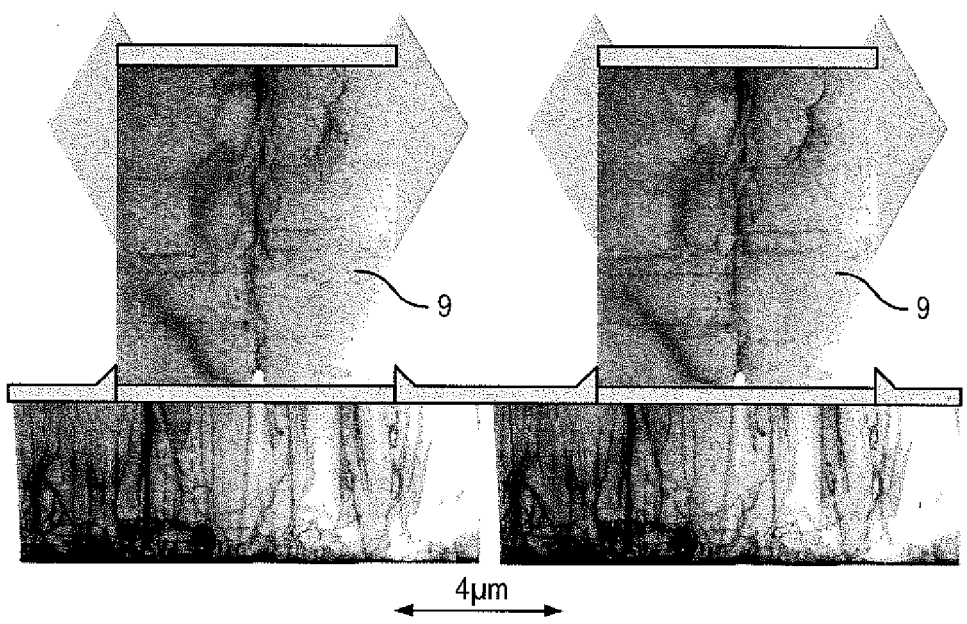
Figure 8C:
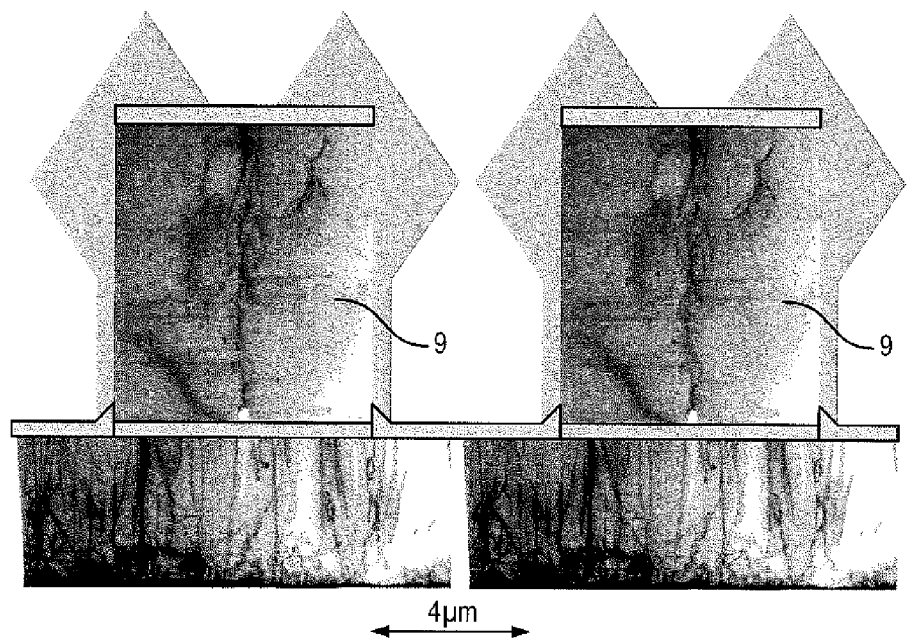
Figure 8D:
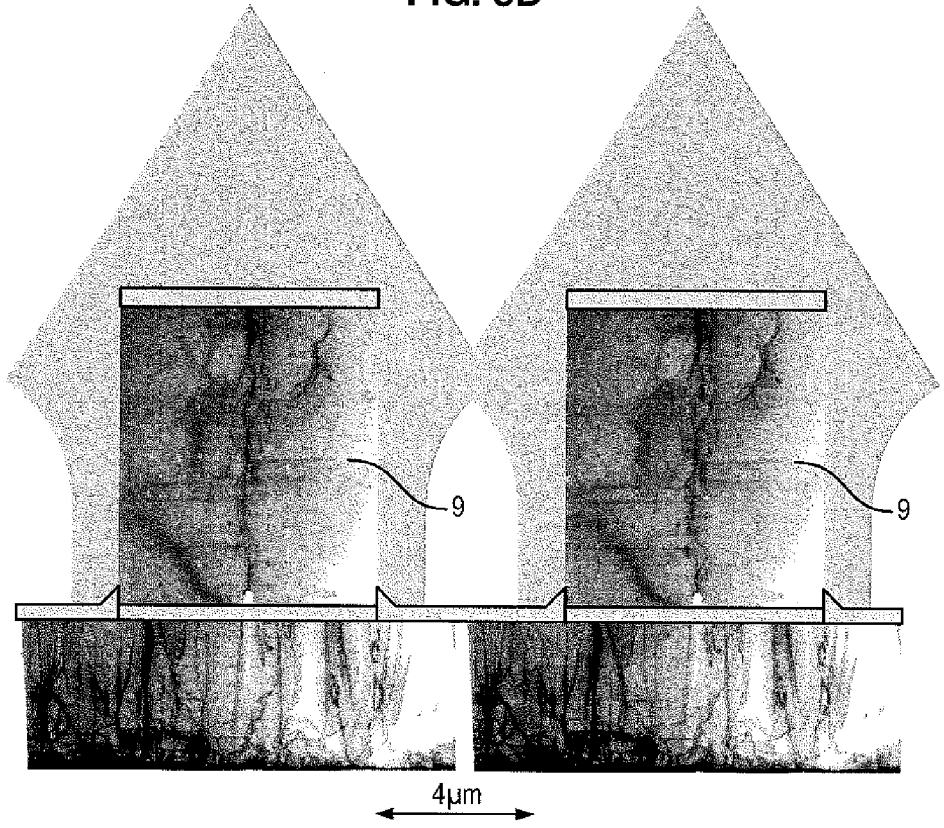
Figure 9A:
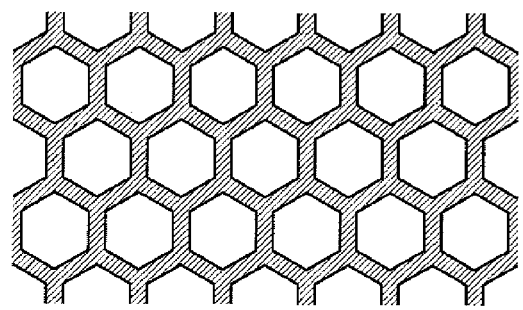
Figure 9B:
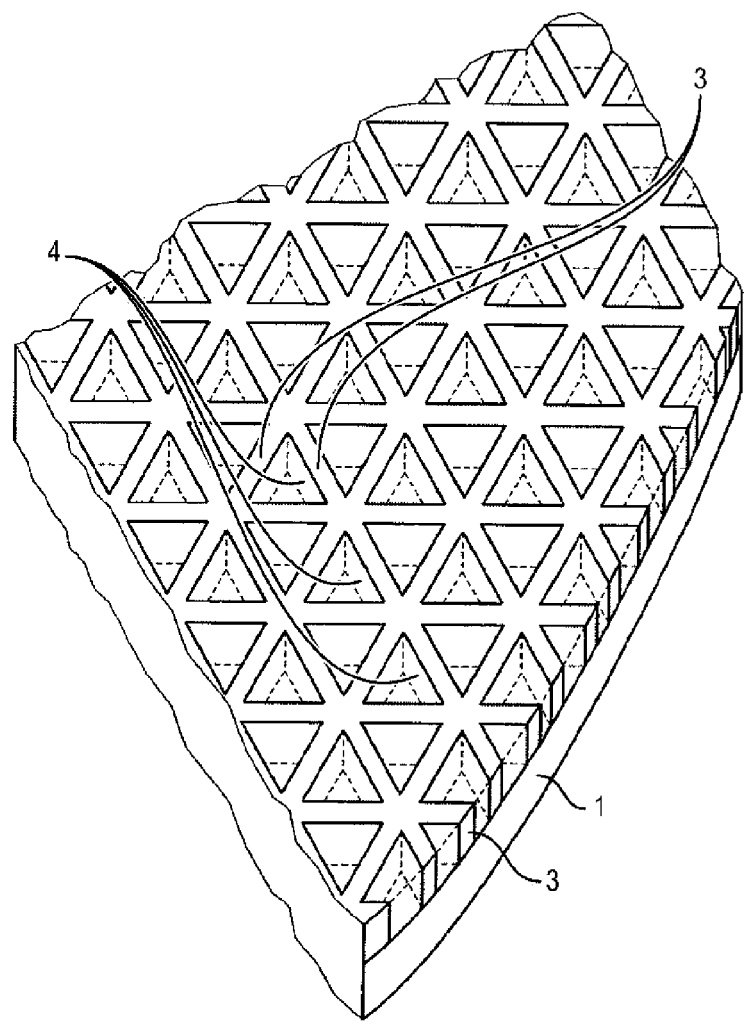
Figure 10:
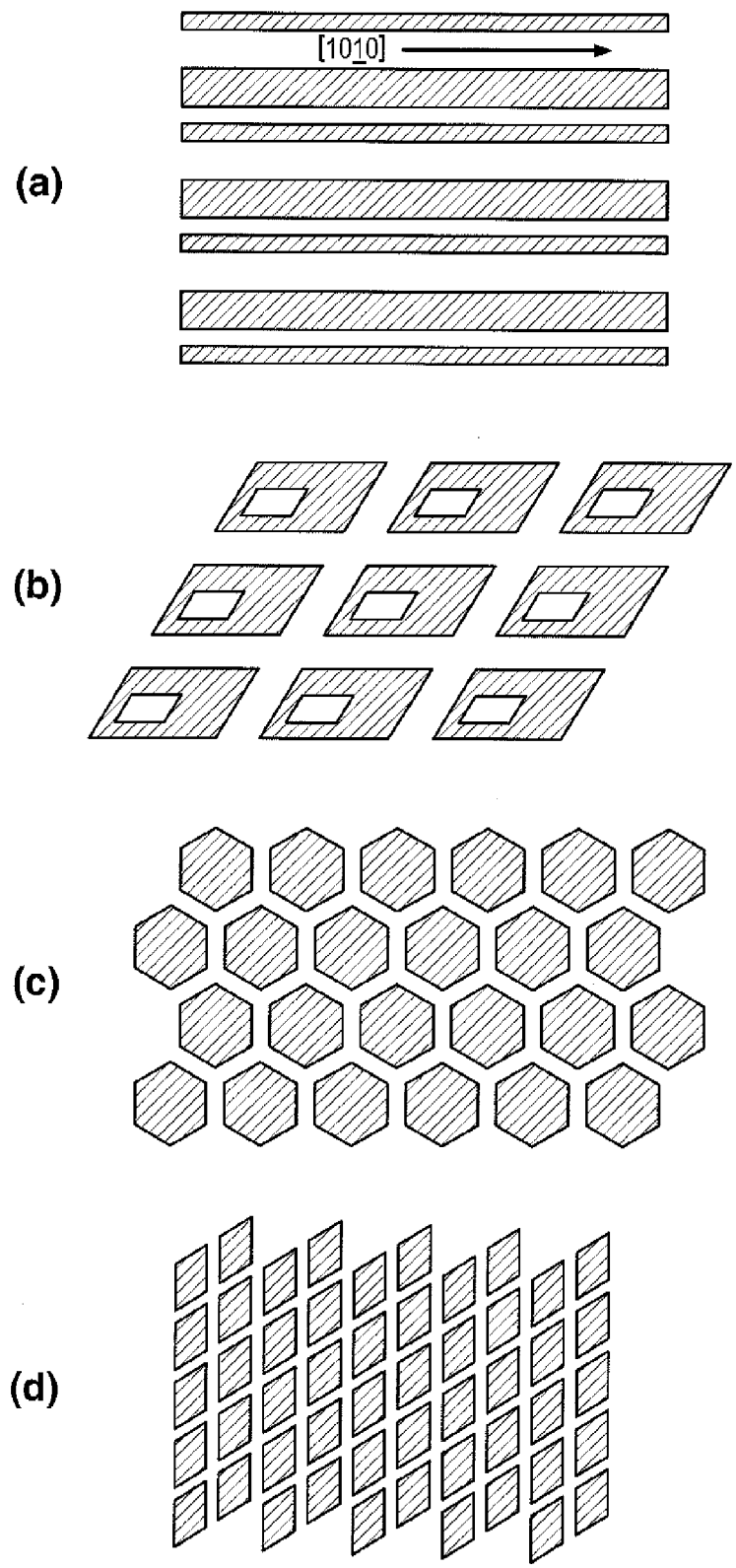
Figure 11A:
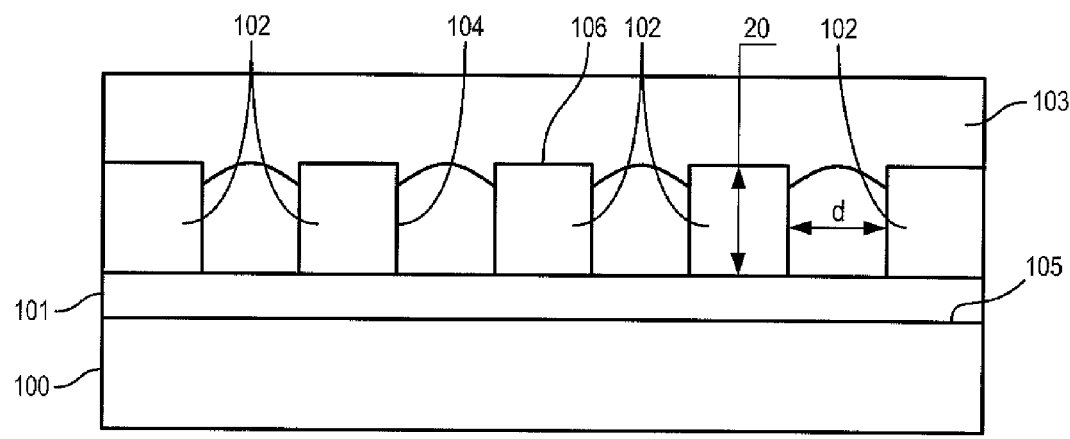
Figure 11B:
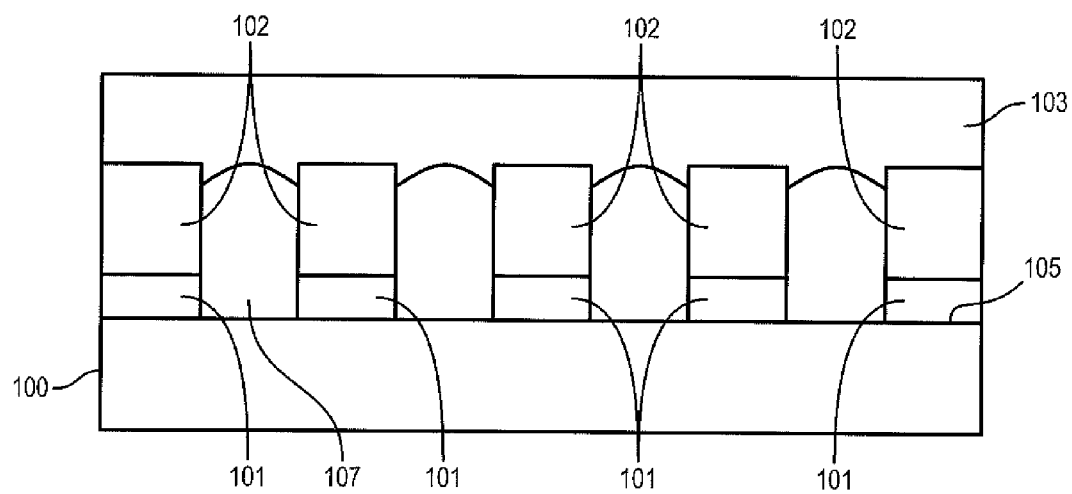

FIG. 7 schematically shows the final step to get epiready GaN wafers;

FIG. 8 illustrates another variation of the pillar formation process when the mask 8 is not removed;

FIG. 9A shows another design of the mask allowing early separation and 9B shows a tridimensional picture of the composite substrate after the second MOVPE growth;

FIG. 10 gathers some of the possible patterns for the openings according to the present invention, FIGS. 11a and 11b are two different embodiment illustrating substrates for manufacturing a single crystal of nitride by epitaxial growth.

DETAILED DESCRIPTION

Generalities on the Invention

As described above, the method according to the present invention combines ELO technology with an original separation process.

In the method according to the invention, the two-step-ELO technology is first used to produce GaN/sapphire for further processing (as described in U.S. Pat. No. 6,325,850).

However, in the present invention, the masks are made of SiO2 or any easily chemically removable selective mask instead of silicon nitride for further easier removal.

The process produces low dislocation density GaN layers in which remaining dislocations are located in the coalescence boundaries, in the middle of the masked area. The thickness of the first ELO layer reaches about 12 µm.

At this stage, a new mask is deposited on top of the as grown layer.

Figure 2A:
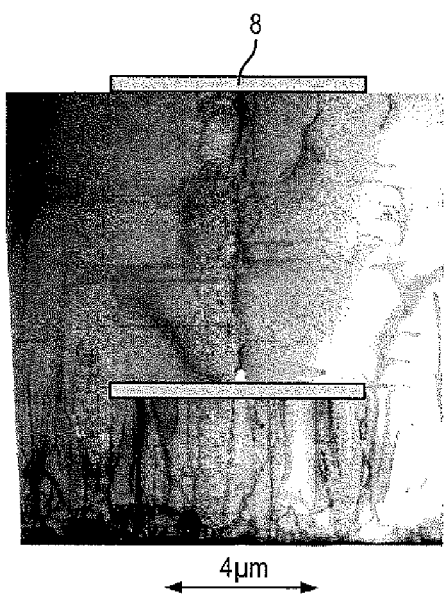

Then this mask is patterned with opening area exactly aligned on the first openings required for the ELO technology like in the MARELO technology described in WO 04105108 and illustrated on FIG. 2A.

Afterwards, deep etching through the openings is carried out by RIE approximately down to the sapphire substrate.

This produces ELO quality GaN pillars that are not directly bond to sapphire, but to chemically removable selective mask.

In another embodiment, the selective mask pattern consists of two dimensional array of openings.

With this mask design, it is possible to remove completely the selective mask after partial or even full coalescence of GaN whereas keeping a coherency strong enough to allow the last HVPE growth. This will be described in details in the example 2.

Figure 2C:
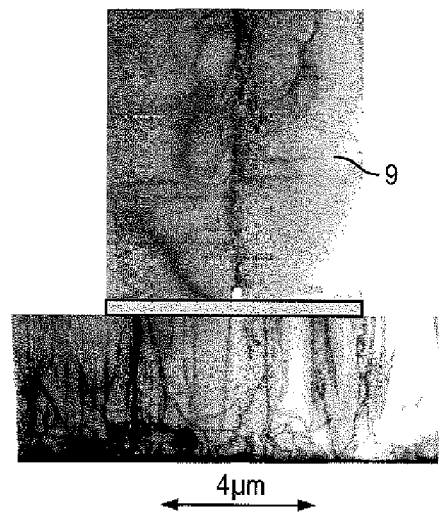
Figure 2B:
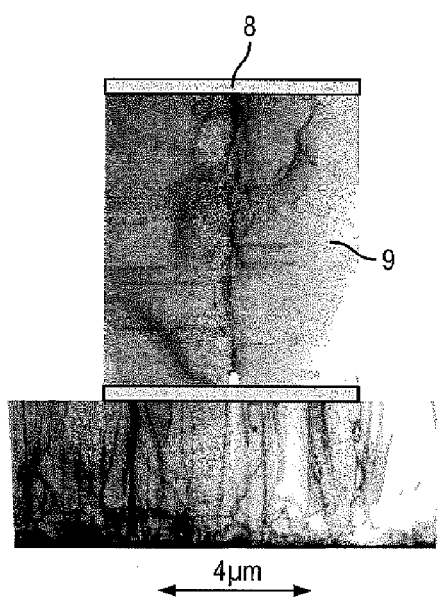

Before, the second epitaxial growth, the mask is selectively deposited on the bottom of the openings that have been created in the GaN ELO layer, down to the sapphire substrate, as illustrated on FIG. 2B.

The top mask is eventually removed.

Growth from pillars is carried out by MOVPE. When the top mask has been removed, growth takes place simultaneously from the lateral {11-20} facets and the top (0001) surface of the pillar.

Henceforth several routes can be followed to produce a flat surface:
- to continue MOVPE growth but change the growth parameters (temperature, pressure, V/III ratio, introduce a surfactant) to enhance lateral growth as well known to the skilled person in the art
- to transfer this layer as grown in the HVPE reactor
- to keep the triangular stripe structure but to get the MOVPE layer thicker for a further safer transfer in the HVPE reactor.

The selective mask remaining on the top of the pillars.

An epitaxial technology able to reach growth rates much higher than MOVPE is thereafter utilized to produce layers thick enough in a manageable time.

Therefore, the process further proceeds by growing a continuous crack-free layer on the MOVPE GaN template by Halide Vapour Phase Epitaxy (HVPE), eventually by Close Space Vapour Transport, CSVT) or Liquid Phase Epitaxy.

As described above an object of the present invention is to provide a method of manufacturing thick GaN substrates by HVPE having an extremely low defect density and little warp and bow from the MOVPE layer on pillars.

The present invention also provides a method for the production of thick, crack-free, layers of GaN for subsequent use for homoepitaxy as pseudo substrates or substrates after separation of the starting non-GaN native substrate.

After having achieved the two-step ELO, the method according to the invention comprises a separation step.

HVPE is carried out until a thickness of at least 200 µm is reached.

Separation of the HVPE layer grown from pillars on posts is achieved by chemically etching the mask. Final separation is eventually achieved by lateral cleaving with a blade.

The invention also relates to the epitaxial gallium nitride layers which can be obtained by the processes encompassed within the scope of the present invention. Advantageously said epitaxial gallium nitride layers have a thickness between 1 µm up to 2 cm and are separated from their substrate.

The invention further relates to a GaN free standing crystal separated from the substrate, which can be obtained by the processes encompassed within the scope of the present invention characterized in that it has a thickness between 10 and 1000 µm but also to a GaN ingot obtained by thickening, by HVPE or CSVT a GaN epitaxial layer obtained by the process according to the present invention.

The present invention also relates to optoelectronic component, especially a diode laser, characterized in that they are provided with an epitaxial layer of gallium nitride as described above.

Growth of ELO GaN

Figure 1A:
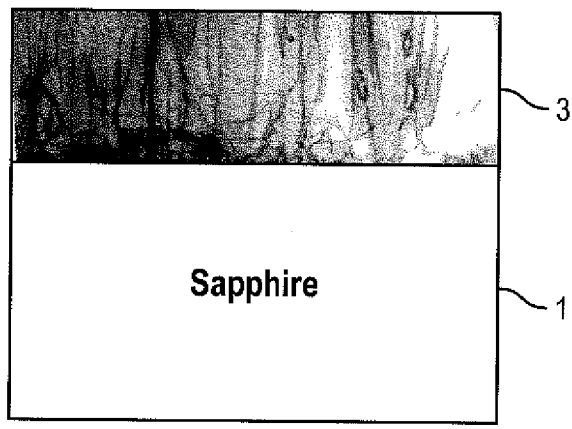
Figure 1B:
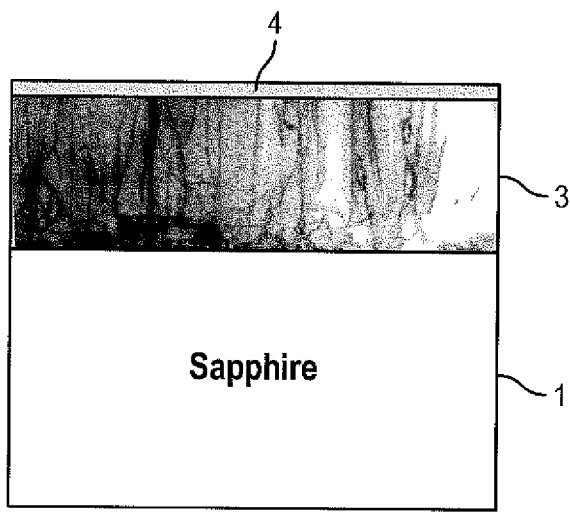
Figure 1C:
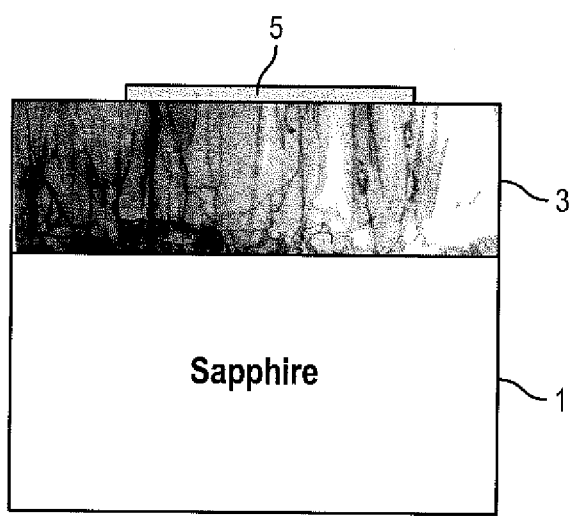

The present invention concerns a process for producing low defect density free standing gallium nitride (GaN) comprising:
- the deposition of a GaN layer by MOVPE on a sapphire substrate as described in U.S. Pat. No. 6,802,902 (ULD), (see FIG. 1A),
- the deposition of a first selective mask with a plurality of first openings forming patterns, (see FIGS. 1B and 1C),
- a first regrowth of a gallium nitride layer on the said mask under epitaxial conditions, (see FIGS. 1D to 1F).

Figure 1D:
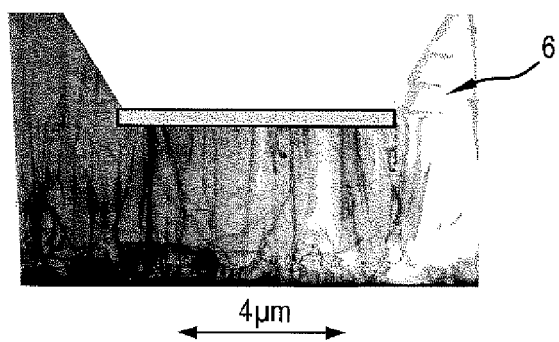
Figure 1E:
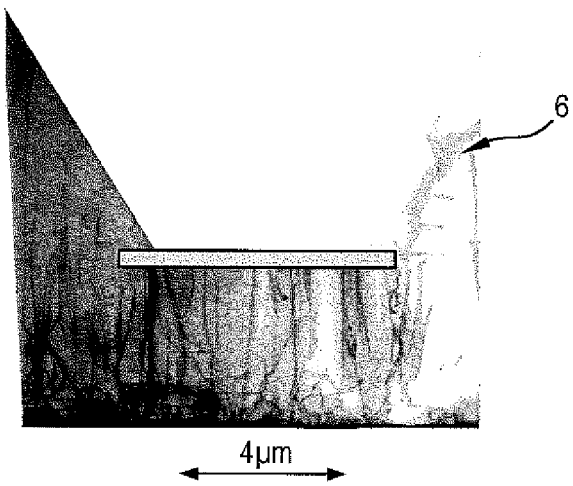
Figure 1F:
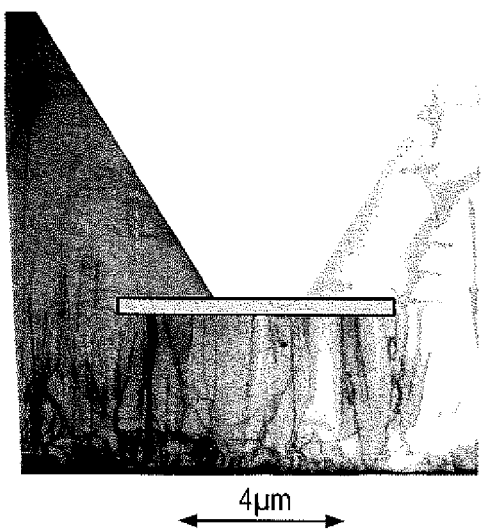
Figure 1G:
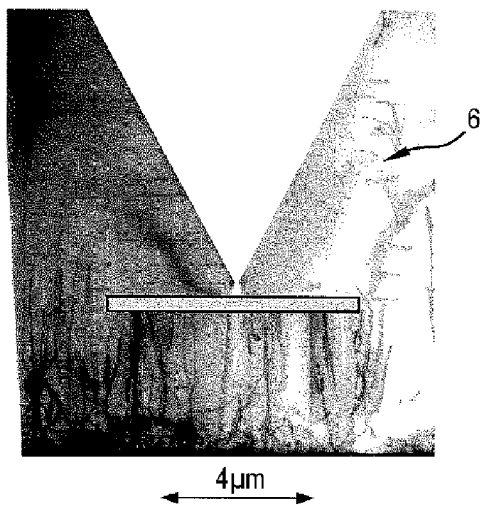
Figure 1H:
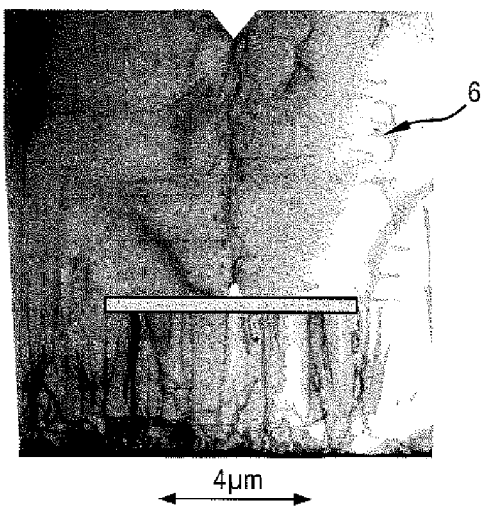
Figure 1I:
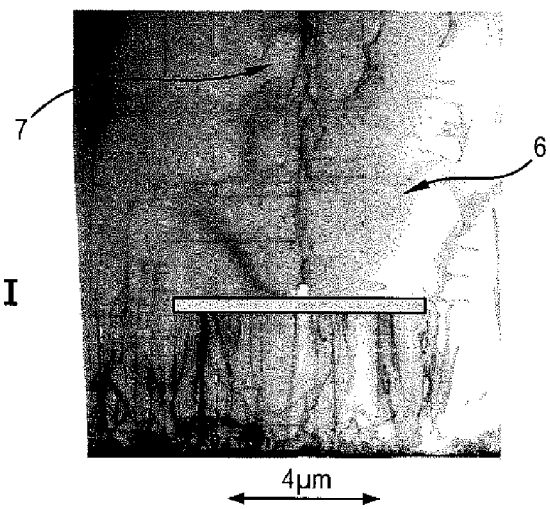

From the figures built from real HRTEM data, it can be noticed that during the first step (FIG. 1D-F, GaN grows in registrery with the GaN template underneath, therefore the Threading Dislocations (TD) propagate mainly parallel to the c axis (growth direction) until they meet the lateral {11-22} facets. Interestingly, they bend at 90° when these TDs meet the lateral facet {11-22} and thereby propagate parallel to the substrate until they reach the coalescence boundaries.

At this stage, a second regrowth of gallium nitride takes place, with growth conditions tuned to enhance lateral growth with respect to the vertical growth so as to induce the deposition of gallium nitride features and anisotropic and lateral growth of said features (see FIG. 1G to 11).

TD density is $\sim 5 \times 10^6$ cm$^{-2}$ between coalescence boundaries.

At the end of this first part of the process, an ELO quality epilayer is obtained on a sapphire substrate as described in U.S. Pat. No. 6,325,850 (see FIG. 11). In the coalescence boundary, remaining TD tend to some extend to spread laterally.

Fabrication of GaN Pillars on Chemically Removable Selective Mask

The next step of the process is the deposition of a second mask with a plurality of second openings forming the same patterns as the first openings exactly above the first ones, providing that the pitch of the pattern of the first openings is the pitch of the second openings (see FIG. 2A).

Several variations of the pitch pattern are foreseen and will be described in examples.

Vertical grooves are then managed by RIE or equivalent technologies down to the GaN substrate, FIG. 2B.

After this step ELO quality pillars running parallel to the [1-100] are defined, such pillars are not in direct contact with the starting buffer GaN starting substrate on sapphire but conversely are lying on a chemically removable material. Eventually, the etching of the GaN epilayer above the first opening can be carried out down to the sapphire substrate.

The top remaining mask is eventually removed by chemical etching, FIG. 2C. In some variations of the process, this top mask layer is not necessarily removed.

Figure 2D:
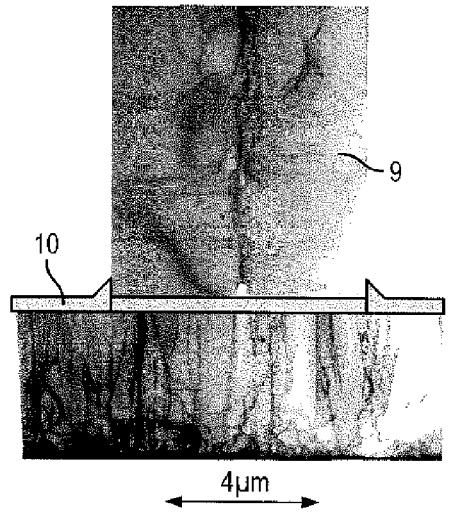

To avoid polycrystalline deposit of GaN during the HVPE growth step, the mask is selectively deposited on the bottom of the grooves (see FIG. 2D).

At this point, the structure is ready for regrowth by a growth technology like HVPE or CSVT able to provide high growth rate of the order of 100 µm/hour.

Growth of GaN Epitaxial Layers from Low Dislocation Density GaN Pillars Sitting on Selective Mask.

During the second epitaxial growth run, which is carried out by MOVPE, GaN growth occurs only on the free GaN surfaces 9.

Figure 3A:
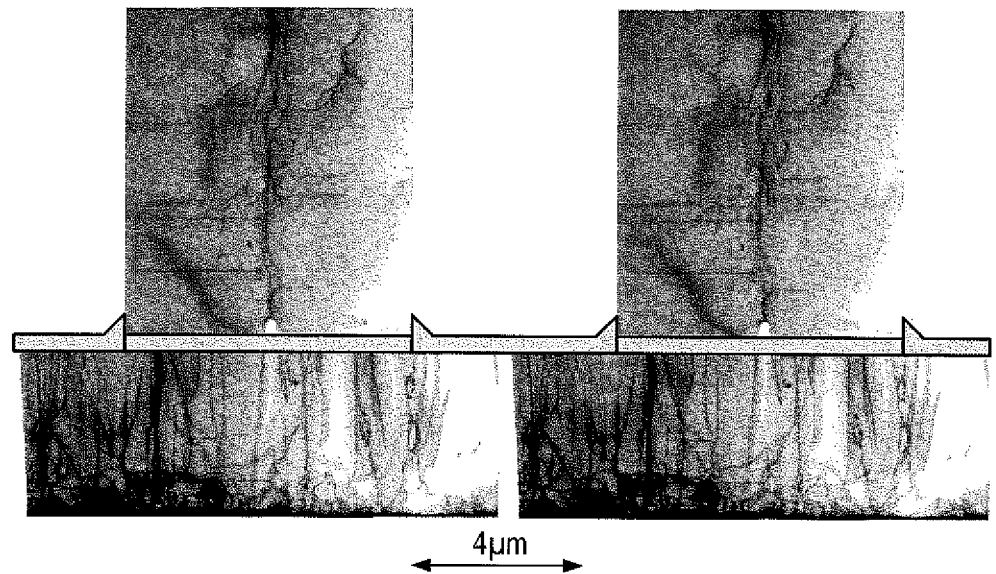
FIG. 3A to 3D illustrates the coalescence process after the formation of pillars and deposition of a protecting layer on the etched GaN.

Since the second growth originates from low dislocation density GaN, no new dislocations are generated. This MOVPE growth step is pursued until full coalescence of laterally grown GaN from the side of the pillars, whether or not the surface is flat. FIGS. 3A, B, C, D After getting coalescence, to get a usable free standing GaN layer, HVPE growth is used to get a convenient growth rate. This HVPE growth is carried out until at least a 300 µm layer is achieved.

After cool down, the mask is etched off chemically, thus separating the thick layer from the starting substrate.

Henceforth a low dislocation density free standing GaN is obtained with TD density $<10^6$ cm$^{-2}$.

After appropriate polishing such a free standing GaN will be ready to be used as a substrate for the growth of device structures, or a seed substrate to grow an ingot.

Figure 4A:
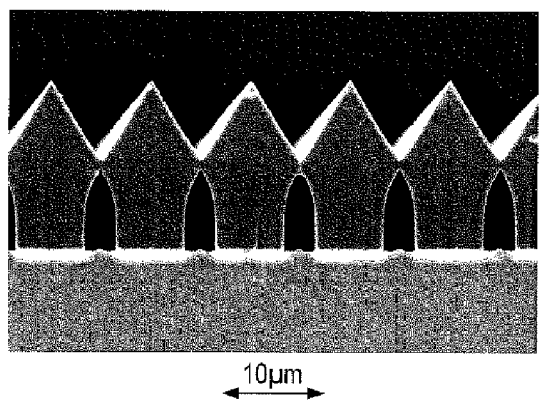
Figure 4B:
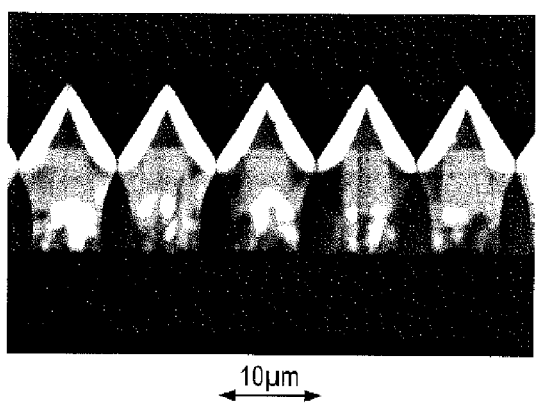
FIG. 4B is the panchromatic cathodoluminescence picture.

In another embodiment, the selective mask at the bottom of the pillars and protective layers are removed before full coalescence Growth conditions are used to end up with triangular stripes covering the pillar until full coalescence (see FIG. 4A).

At the end of this growth, the surface appears as a perfected ordered array of triangular stripes.

This method further proceeds by growing a continuous crack-free layer on the MOVPE GaN template by Halide Vapour Phase Epitaxy (HVPE), eventually by Close Space Vapour Transport, CSVT} or even Liquid Phase Epitaxy (LPE)

Fourth HVPE Regrowth and Separation

The as previously described structures, i.e, ELO quality GaN pillars lying on the selective mask are introduced in a HVPE reactor able to hold six 2" wafers. Regrowth is carried out in epitaxial conditions.

This method further proceeds by growing a continuous crack-free layer on the MOVPE GaN template by Halide Vapour Phase Epitaxy (HVPE), eventually by Close Space Vapour Transport, CSVT) or Liquid Phase Epitaxy (LPE)

To be used as an epiready 2" wafer, the separated HVPE thick layer is lapped and polished using technologies well known by the person skilled in the art.

In the coming examples, 2" wafers were used. However, the method is scalable to much wider diameters of starting substrates.

Example 1

The Method of Manufacturing Such Substrates Comprises Several Steps as Schematically Shown on FIGS. 1 and 2

Epitaxial growth is carried out using preferably by Metal Organic Vapour Phase Epitaxy (MOVPE) for the fabrication of GaN pillars, even though other vapour phase epitaxy techniques such as Halide Vapour Phase Epitaxy (HVPE) and close space Vapour Phase transport (CSVT, also refereed as sublimation) can also be used.

The substrate 1 generally has a thickness of a few hundred µm (in particular approximately 300 µm) and may be chosen from the group consisting of sapphire, ZnO, 6H—SiC, 4H—SiC, 3C—SiC, Si, LiGaO2, LiAIO2, MgAl2O4, ZrB2, GaAs, HfB2, AIN, GaN, and advantageously is sapphire (0001).

The following paragraphs are directed to a preferred process to produce the GaN layer 3.

This process for producing a layer of gallium nitride (GaN) is remarkable in that it comprises the deposition on a substrate of a silicon nitride layer functioning as a nanomask and the growth of GaN on the masked substrate under epitaxial deposition conditions so as to induce the deposition of gallium nitride features and the anisotropic growth being continued until coalescence of the various features. The term "islands" or "features" may also be employed.

The gaseous vehicle is a mixture of nitrogen and hydrogen in equal proportions. The ammonia is introduced together with the silane, in a form diluted to 50 ppm in hydrogen.

Under these conditions, the typical NH3 and SiH4 reaction time ranging from 60 to 360 seconds.

The successive steps are monitored by laser reflectometry (LR). After the silicon nitride layer has been formed, a continuous gallium nitride layer having a thickness of 20 to 30 nm is deposited on it. The deposition of the GaN layer is made at a low temperature, of the order of 600° C.

After the deposition of the GaN layer has been completed, it is annealed at a high temperature of the order of 1080° C. Under the combined effect of the temperature rise, of the presence in the gaseous vehicle of a sufficient amount of hydrogen and of the presence of the very thin SiN film beneath the GaN layer and also the antisurfactant effect of silicon, the morphology of said GaN layer undergoes deep modification resulting from solid-phase recrystallization by mass transport.

When the temperature approaches 1060° C., the reflectivity of the buffer layer suddenly decreases. The initially continuous buffer layer is then converted into a discontinuous layer formed from gallium nitride pyramids.

At the end of this spontaneous in situ recrystallization process, GaN features or islands of very good crystal quality are obtained, these retaining an epitaxial relationship with the substrate by virtue of the very small thickness of the SiN layer.

During the subsequent epitaxial regrowth with gallium nitride, the GaN features or islands develop by lateral and vertical growth. GaN layers 3 have thus been obtained by full coalescence of the GaN features having a defect density of the order of $10^8$ cm$^{-2}$.

A SiO2 mask 4 is then deposited on such a GaN layer. Linear apertures 3 µm in width and spaced apart by 7 µm are then made in the mask in order to expose the regions of the subjacent layer. The linear apertures 5 are advantageously oriented in the GaN [1-100] direction, although the variant of the process described in this example can be optionally carried out for other orientations of the linear apertures, especially in the GaN [11-20] direction.

The epitaxial regrowth is carried out on the exposed regions 6 with unintentionally doped GaN under operating conditions such that the growth rate in the [0001] direction of the GaN features sufficiently exceeds the growth rate in the direction normal to the inclined flanks of said features. Under such conditions, the anisotropy of the growth results in the disappearance of the (0001) facet.

The first implementation step of the process is completed when the (0001) facet of the GaN feature has fully disappeared. At the end of the first step, the GaN features are in the form of a stripe with {11-22} lateral facets, the cross section of which is triangular.

However, it is possible to continue the first step until coalescence of the GaN features, in order to completely cover the mask and even to pursue the growth in these conditions.

The next step consists of the epitaxial regrowth, with experimental conditions chosen as to enhance lateral growth. In these new experimental conditions, the facet (0001) reappears at the top of each of the GaN features obtained in the first step. During this step, the GaN features develop with an expansion of the facet (0001) and, conversely, a reduction in the area of the flanks. This effect is obtained by increasing the temperature up to 1150° C. or decreasing the operating pressure, or increasing the V/III ratio in the vapour phase or even adding Mg, Sb or Bi in the vapour phase. The second step of the process according to the example is completed when the flanks have disappeared, the upper surface of the deposit formed by the coalesced doped-GaN features then being flat. (see FIG. 1I).

Because of the bending at 90° of the TDs, the upper surface formed by the coalescence of the GaN features is virtually free of emerging defects in regions compatible with the size of electronic devices, such as GaN diode lasers. Remaining TDs appear on the coalescence boundaries.

Such a process produces GaN with TDs<$4 \times 10^7$ cm$^2$ measured on the whole surface including the coalescence region, but only $5 \times 10^6$ cm$^{-2}$ on the top of the stripes.

On the top surface of this ELO quality template, a second mask 8 is deposited exactly above the first one.

The first mask layer 4 and the second mask layer 8 (see FIG. 2A) are constituted of silicon oxide deposited by CVD.

Each of the masks has a plurality of openings extending in the GaN [1-100] direction (perpendicular of the drawing of FIG. 2).

In each of the first mask layer 4 and the second mask 8, a width for the mask area is for instance 2-5 µm and a pitch for example 5-15 µm. The mask and the pitch are identical between the first and the second mask respectively.

Deep etching down to the first mask 4 level or even deeper is achieved by RIE (see FIG. 2B), thus creating {11-20} facets 9.

Eventually a thick SiO2 deposit 10 is achieved on the bottom of the grooves to avoid a polycrystalline GaN deposit during the next growth step.

After removing the top mask 8 (see FIG. 2C), the pillar structure is introduced once again in the MOVPE reactor. The growth conditions are tuned to enhance lateral growth like in [0000].

Figure 3B:
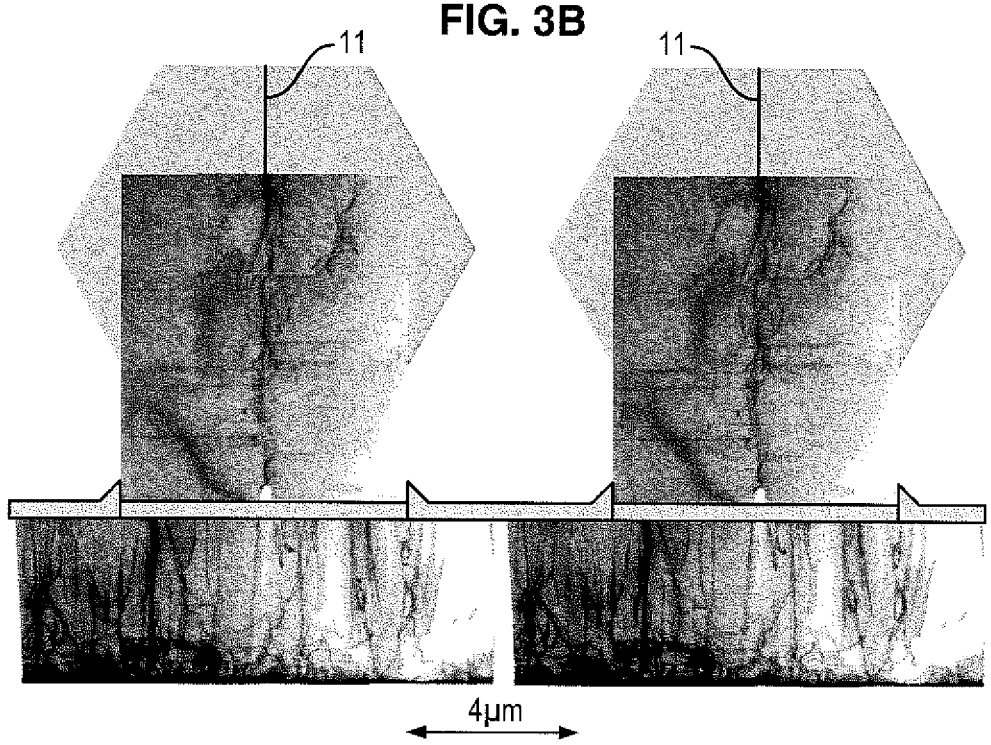
Figure 3C:
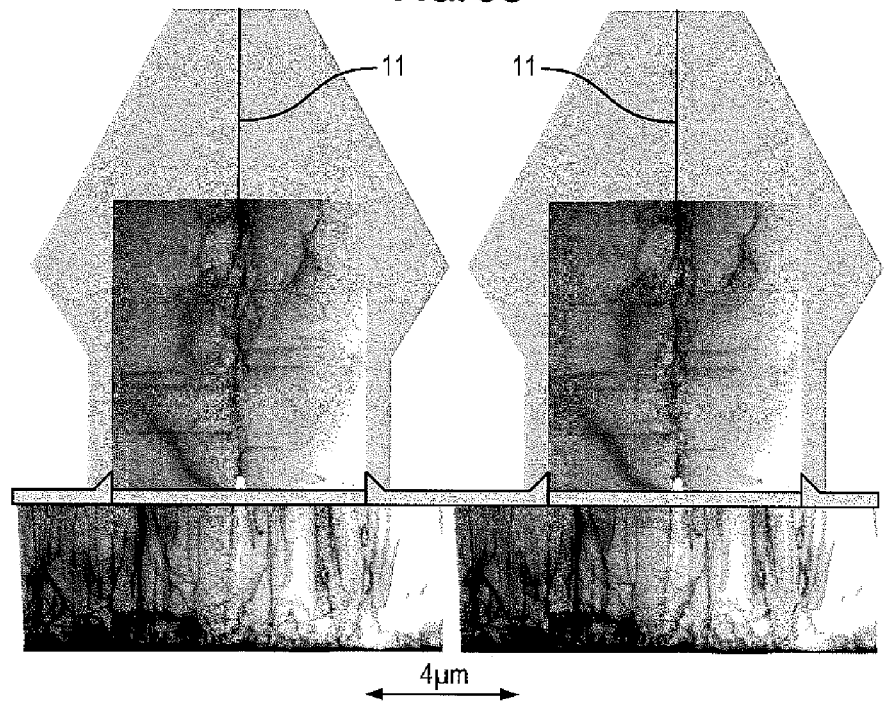

Growth simultaneously starts from the top facets and the lateral {11-20} facets (see FIGS. 3A-3B). Since the pillars were grooved in high quality ELO GaN, no new dislocation is generated. The only remaining dislocations come from the coalescence boundaries 11, which propagate in the growing GaN.

When the process further proceeds (see FIG. 3C), GaN grown from lateral facets extends down to the bottom of the grooves. TD 12 are eventually formed when two triangular stripes coalesce (see FIG. 3D).

In these growth conditions, the triangular stripe structure remains unless growth parameters are changed.

It has to be noticed that the triangular growth allows limiting the TDs due to the first growth since the TDs bend by 90° to adopt a direction along the (0001) basal plane so that they propagate. After bending, most of the dislocations have a line parallel to [1-210] which extends to the coalescence boundary 12 with the overgrown GaN coming from the adjacent stripe. The boundary 12 is therefore an area of defect accumulation.

FIG. 4A shows a cross sectional SEM image of such an array. Such material that grows from almost dislocation free GaN pillars keeps the high crystallographic quality of the pillars.

Panchromatic cathodoluminescence (CL) image shows that material grown on the lateral {11-22} facets on top of the pillars exhibit high luminescence intensity as expected from growth on lateral facets. Actually O incorporation in these lateral facets is enhanced therefore resulting on high CL emission. (see FIG. 4B).

A full understanding of the growth process from pillars is provided by wavelength resolved cross sectional cathodoluminescence.

Figure 5:
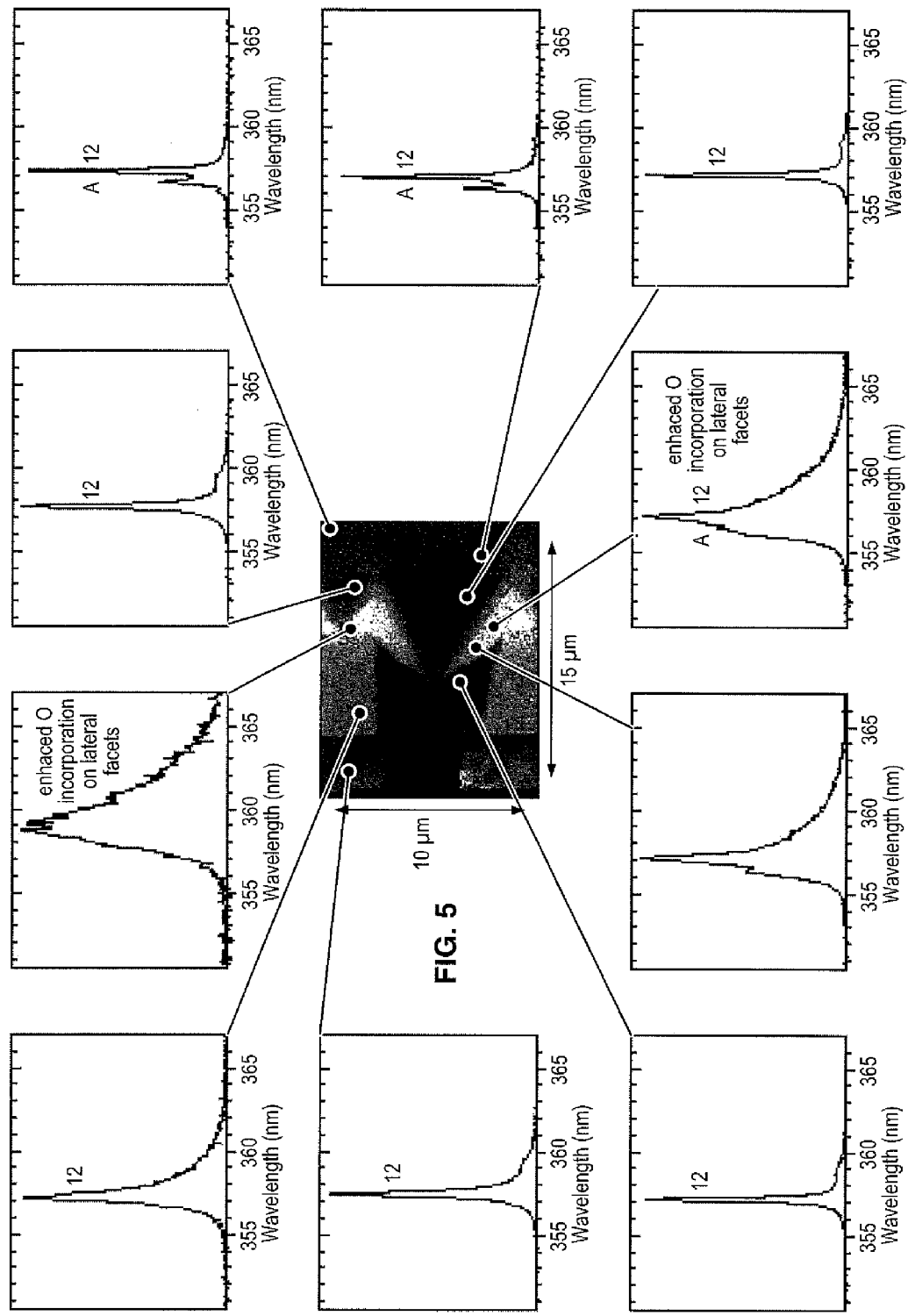
FIG. 5 is a cross sectional wavelength resolved cathodoluminescence mapping of GaN regrown from pillars.
Figure 6A:
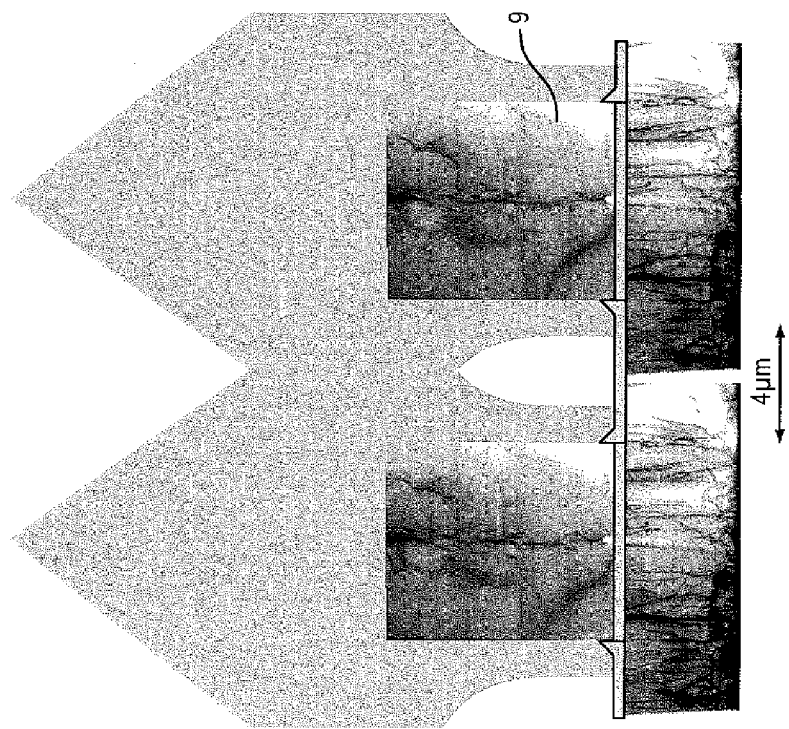
FIG. 6 illustrates the growth by HVPE of a thick GaN layer from the triangular stripe array.
Figure 6B:
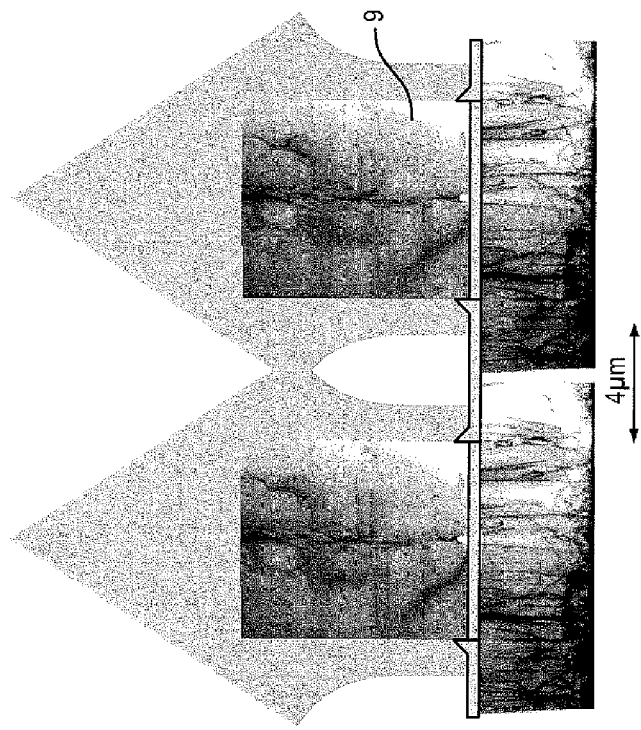
Figure 6C:
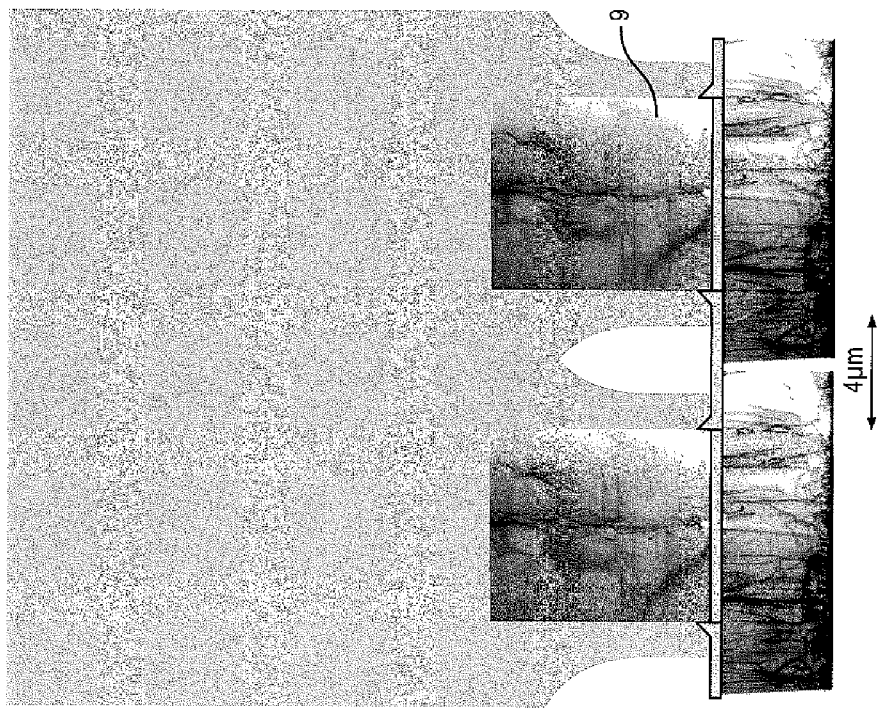
Figure 6D:
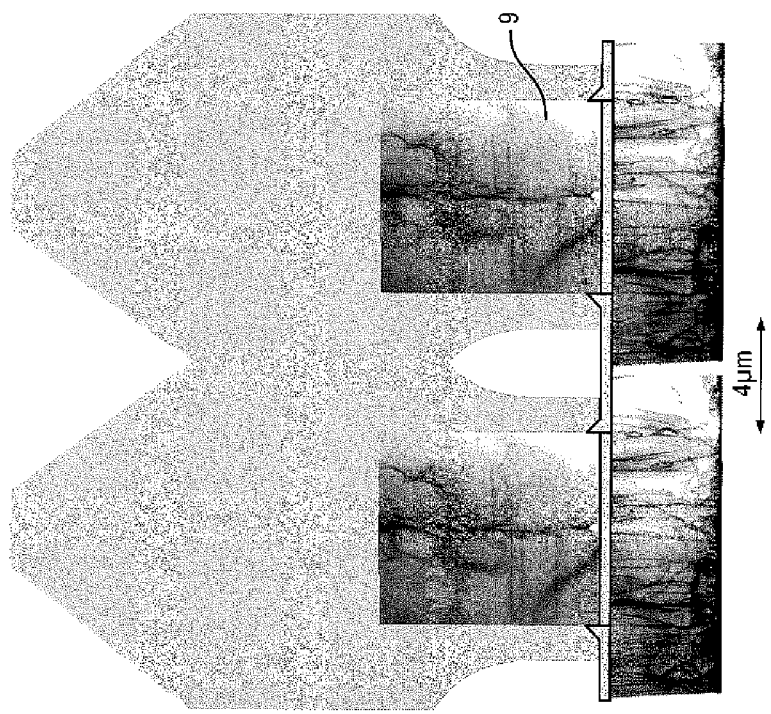

FIG. 5 displays such data where the hole created between stripes is easily recognizable together with two lateral pillars grown by the two step ELO process by a single narrow CL peak corresponding to 12 (donor bound exciton).

As growth further proceeds from lateral facets, enhanced incorporation of O results in broadening of the CL emission. After coalescence, the CL peak get narrower and the 12 emission corresponds to fully relaxed GaN. In addition, due to the high quality of material, the free exciton A emission appears.

Alternatively, growth conditions may be changed after growth of several µm to get a flat surface.

At this stage, low dislocations density ($<10^7$ cm$^{-2}$) GaN layers are obtained, with some accumulation of TDs at the coalescence boundaries.

HVPE Thick Layers

To get a useable free standing wafer, a thickness of at least 300 µm should be reached; such a thickness is not achievable by MOVPE. Therefore, another growth technology can be implemented to get the appropriate thickness and to scatter the TDs from the coalescence boundaries and further decrease the TD density.

The deposition of GaN in accordance with the present invention for thick layers growth is advantageously carried out by a high growth rate vapour phase epitaxy (HVPE) technique.

The invention provides an HVPE nitride growth reactor, which is particularly designed for growth of GaN thick epitaxial films. More specifically, this HVPE reactor allows holding 6×2" wafers on a rotating susceptor.

The reactor is configured in a resistively heated furnace tube in the conventional manner, with the furnace being vertically oriented. The reactor provides two distinct parts, namely, one for the GaCl synthesis, and the other for the growth. With this configuration, GaCl is formed in situ upstream of the growth chamber, into which it is then delivered. In the growth chamber, a susceptor supports up to 6 GaN/sapphire templates on which the epitaxial layer is to be grown. GaCl is delivered to the growth chamber in the vicinity of the susceptor to achieve the growth process. NH3 is also delivered in the vicinity of the susceptor in such a way that premature mixing with GaCl is avoided.

The HVPE process is a chemical vapour deposition method carried out in a hot wall reactor. The gallium precursor, gallium monochloride GaCl employed in the deposition process is formed within the reactor, upstream from the GaN/sapphire templates, by the reaction of HCl with liquid Ga, at high temperature. GaCl is then transported by a carrier gas to the substrate downstream in the reactor where it reacts with NH3 at a temperature between 800-1200° C. to form GaN, via the reaction: GaCl+NH3→GaN+HCl+H2.

In HVPE growth of GaN, Ga metal can be readily obtained with a purity of more than 99.9999% and with a properly designed gas delivery system, HCl gas with purity more than 99.99% purity can be provided using an appropriate in line getter.

To obtain desirable high throughput with acceptable overall process duration, growth rates in excess of 50 µm/hr are advantageously employed. Growth is beneficially carried out at temperatures between about 900 and about 1150° C.

To get the best quality GaN by HVPE, a technology involving multiple bending of TDs is implemented.

However, other options are also feasible like remaining at constant temperature (high temperature to get a flat surface, moderate temperature to keep the triangular stripe array until completion of the thick layer growth)

Figure 3D:
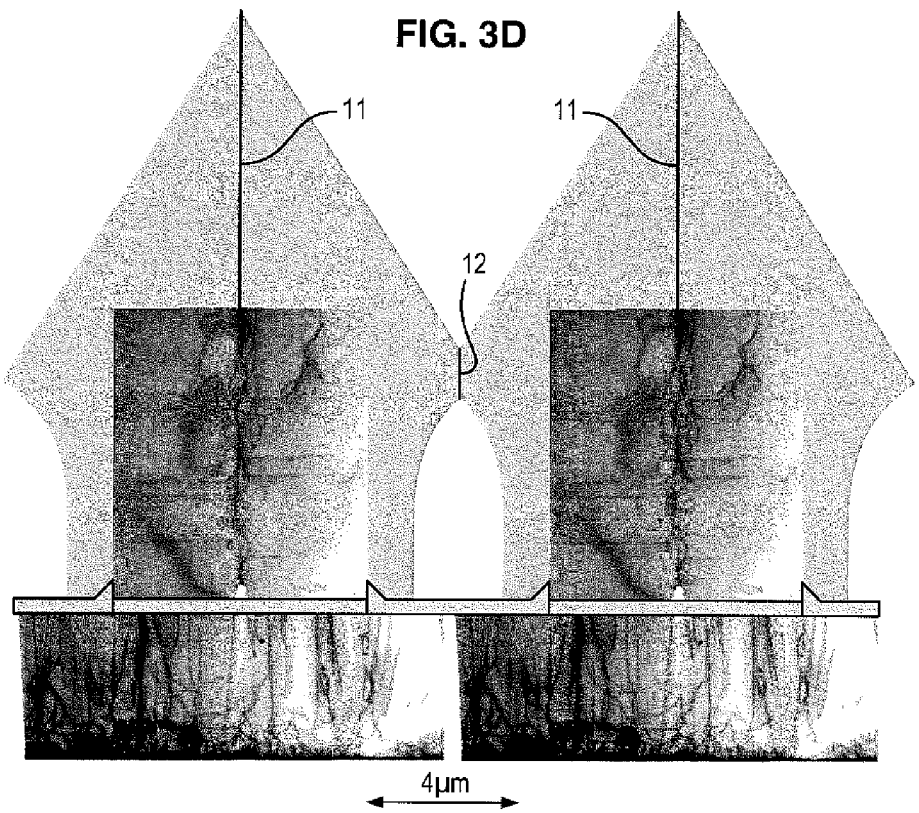

The MOVPE/sapphire templates are introduced in a multiwafer HVPE reactor operating at low pressure, without any further technological step like cleaning or etching. The morphology of the GaN/sapphire starting template appears as an array of triangular stripes as shown in FIG. 3D.

Preferentially, the growth conditions are changed at the end of the HVPE growth to get a flat surface with Ga polarity.

After cooling down under NH3 atmosphere, the composite substrate is ready for preparing a free standing epiready wafer.

The perimeter of the substrate is chamfrained to remove polycrystalline deposit, thus allowing the buried SiO2 mask to be chemically etched.

The as chamfrained composite substrate is immersed in an HF solution overnight.

SiO2 dissolves starting from the perimeter and finally the sapphire substrate separates and can eventually re-used.

The MOVPE layer is removed by lapping and the final free standing GaN is polished using technologies well known by persons in the field.

Additionally, impurities (doping species, surfactants, transition metal) can be added during growth of the thick GaN layer and thereby allow the production of n type, p-type or semi-insulating GaN wafers.

FIGS. 6A to 6D show the morphological evolution of the GaN layer during the HVPE growth and FIG. 7 schematically illustrates the different steps to get the epiready GaN wafer.

Such a free standing GaN wafer present TDs densities<$10^6$ $cm^{-2}$, that are uniformly distributed on the top Ga face surface. Indeed, the HVPE step inducing multiple TD bendings results in a redistribution of TD at the coalescence boundaries from the MOVPE steps.

Example 2

In example 2 however, after grooving the stripes to form pillars, the top mask 8 is not removed. Growth is allowed to restart in MOVPE.

As expected, growth starts from the {11-20} facets resulting from the RIE groove to finally coalescence into triangular stripes with {11-22} lateral facets as in example 1. The FIG. 8 schematically shows the evolution of the facets structure as growth proceeds.

At this stage, the structure is introduced in the multiwafer HVPE reactor and growth takes place according one of the variations described in example 1. After all the technological processes described in example 1, a free standing GaN wafer presenting TDs densities<$10^6$ $cm^{-2}$, that are uniformly distributed on the top Ga face surface is obtained. Indeed, once again, the HVPE step inducing multiple TD bendings results in a redistribution of TD at the coalescence boundaries from the MOVPE steps.

Example 3

In example 3 the mask pattern for both the ELO process and the groove of pillars is a two dimensional array of hexagons (see FIG. 9A). The ELO GaN is grown as in example 1. When the first step of MOVPE ELO is achieved, a second mask consisting in an array of hexagons as shown in FIG. 9A is deposited exactly above the first one. Afterward RIE etching, a "honeycomb" structure is formed (see FIG. 8B). Conversely to previous examples, at this stage, etching can be achieved, at least partially, from the top surface. This will make the final separation easier.

These MOVPE/sapphire templates are introduced in a multiwafer HVPE reactor operating at low pressure, and the rest of the process follows previous examples. After all the technological processes described in example 1, a free standing GaN wafer presenting TDs densities<$10^6$ $cm^{-2}$, that are uniformly distributed on the top Ga face surface is obtained.

Example 4

In example 4, other arrays of openings are used. FIG. 10. Among them, asymmetric openings are used, thus allowing a multiple bending of TDs at Other mask design.

It will be appreciated that many changes can be made to the embodiment as described above within the scope of the invention. For instance, FIGS. 11a and 11b shows pillars comprising superior faces parallel to the growth face 105 of the support 100. However, the present invention is not limited to pillars comprising a superior face parallel to the growth face 105 of the support 100. The pillars may comprise rounding superior face or sawtooth superior face or triangular superior face.

The invention claimed is:
1. A method for manufacturing a single crystal of nitride by epitaxial growth on a support (100) comprising a growth face (105), the method comprising the steps of:
   formation of a sacrificial bed (101) on the support (100), wherein a plurality of first openings within the sacrificial bed expose portions of the growth face;
   epitaxial growth of a layer including a material compatible with GaN epitaxial growth, wherein the layer is grown from the portions of the growth face and extending over the sacrificial bed;
   formation of pillars (102) on said sacrificial bed, said pillars being formed by patterning the layer;
   formation of a first mask between the pillars, wherein at least a portion of the mask covers a portion of the growth face;
   growth of a nitride crystal layer (103) on the pillars, under growing conditions such that the nitride crystal layer does not extend down to the support within the holes (107) formed between the pillars; and
   removing the nitride crystal layer from the support.
2. The method according to claim 1, wherein each pillar of the pillars (102) comprises walls (104), said walls being perpendicular to the growth face of the support.
3. The method according to claim 1, wherein the pillars (102) have substantially the same height (D).
4. The method according to claim 1, wherein the pillars (102) have superior faces defining a growth face, the superior faces being above 20% of an overall surface of a growth face of the support.
5. The method according to claim 4, wherein the superior faces of the pillars (102) define a growth face accounting for below 80% of the overall surface of the growth face of the support.
6. The method according to claim 1, wherein the pillars (102) define a ratio D/d of a height D of one pillar to a distance d between two adjacent pillars, and wherein the ratio D/d is greater than or equal to 1.5.
7. The method according to claim 6, wherein the ratio D/d is greater than or equal to 2.
8. The method according to claim 1, wherein the pillars (102) are discrete pillars, separated from each other by a distance (d).
9. The method according to claim 1, wherein the pillars (102) are uniformly distributed on the support.
10. The method according to claim 1, wherein the pillars (102) are made of GaN.
11. The method according to claim 1, wherein the sacrificial bed (101) comprises a chemically removable material.
12. The method according to claim 11, wherein the sacrificial bed (101) comprises $SiO_2$.
13. The method according to claim 1, wherein the layer including the material compatible with GaN epitaxial growth comprises GaN.
14. The method according to claim 1, wherein patterning the layer including the material compatible with GaN epitaxial growth comprises:
   deposition of a second mask on the layer, said second mask comprising a plurality of second openings; and
   etching the layer to form the pillars (102).
15. The method according to claim 14, wherein the plurality of the second openings form a same pattern as the plurality of the first openings, and the second mask is placed to match the second openings with the first openings.

16. The method according to claim 1, wherein removing the nitride crystal layer from the support comprises etching the sacrificial bed.

17. A substrate for manufacturing a single crystal of nitride by epitaxial growth, said substrate comprising a support and a plurality of pillars on the support, wherein said substrate further comprises a sacrificial bed between the support and the pillars as defined in claim 1, wherein a ratio D/d of a height D of one pillar to a distance d between two adjacent pillars is greater than or equal to 1.5.

18. A semiconductor material comprising a substrate and a single crystal of nitride on the substrate, wherein said substrate comprises a support, a sacrificial bed on the support, and a plurality of pillars on said sacrificial bed as defined in claim 1, wherein a ratio D/d of a height D of one pillar to a distance d between two adjacent pillars is greater than or equal to 1.5.

19. A single crystal of nitride comprising pillars, said single crystal being obtained by a method according to claim 1, wherein a ratio D/d of a height D of one pillar to a distance d between two adjacent pillars is greater than or equal to 1.5.

* * * * *